(12) United States Patent
Ishibashi et al.

(10) Patent No.: US 6,479,171 B1
(45) Date of Patent: Nov. 12, 2002

(54) ORGANIC ELECTROLUMINESCENT DEVICE

(75) Inventors: Tadashi Ishibashi; Mari Ichimura; Shinichiro Tamura, all of Kanagawa (JP)

(73) Assignee: Sony Corporation (JP)

( * ) Notice: Subject to any disclaimer, the term of this patent is extended or adjusted under 35 U.S.C. 154(b) by 89 days.

(21) Appl. No.: 09/624,769

(22) Filed: Jul. 25, 2000

(30) Foreign Application Priority Data

Jul. 30, 1999 (JP) .......................... 11-216307

(51) Int. Cl.$^7$ .............................. H05B 33/14
(52) U.S. Cl. .................. 428/690; 428/703; 428/917; 313/504; 313/506; 257/40; 257/103
(58) Field of Search .................. 428/690, 703, 428/917; 313/504, 506; 257/40, 103

(56) References Cited

U.S. PATENT DOCUMENTS 4,012,376 A * 3/1977 Wright ..................... 260/240

FOREIGN PATENT DOCUMENTS

JP 7-188649 7/1995

OTHER PUBLICATIONS

"Organic Electroluminescent Diodes", C.W. Tang & S.A. VanSlyke, Appl. Phys. Lett. 51 (12) Sep. 21, 1987.

"Electroluminescence in Organic Films with Three Layer Structure" Japanese Journal of Applied Physics vol. 27, No. 2, Feb., 1988, pp. L269–271.

"Electroluminescence of Doped Organic Thin Films" C.W. Tang, S.A. VanSlyke, and C.H. Chen, Corporate Research Laboratories, Eastman Kodak Company, Rochester New York 14650–02122 pp. 3610–3615, No Date.

"Inorganic and Organic Electroluminescence", 96 Berlin, R.H. Mauch and H.E. Gumlich pp. 101–104, No Date.

* cited by examiner

Primary Examiner—Deborah Jones
Assistant Examiner—Ling Xu
(74) Attorney, Agent, or Firm—Rader, Fishman & Grauer PLLC; Ronald P. Kananen, Esq.

(57) ABSTRACT

An organic electroluminescent device of the type comprises an organic layer 5, 5a or 5b, having a luminescent region, which contains a julolidyl-substituted styryl compound represented by the following general formula [I]

General Formula [I]:

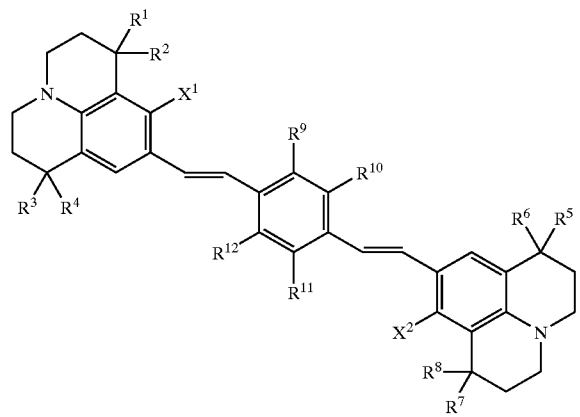

wherein $X^1$ and $X^2$ independently represent a hydrogen atom, a hydroxyl group or an alkoxy group such as a methoxy group, $R^1$ to $R^8$ independently represent a lower alkyl group such as a methyl group, and $R^9$ to $R^{12}$ independently represent an electron attracting group such as a cyano group.

9 Claims, 9 Drawing Sheets

EL EMISSION SPECTRUM

VOLTAGE-LUMINANCE
CHARACTERISTIC

EXAMPLE 2

EL EMISSION SPECTRUM

EXAMPLE 2

VOLTAGE-LUMINANCE CHARACTERISTIC

EXAMPLE 3

EL EMISSION SPECTRUM

EXAMPLE 3

VOLTAGE-LUMINANCE CHARACTERISTIC

ORGANIC ELECTROLUMINESCENT DEVICE

BACKGROUND OF THE INVENTION

This invention relates to an organic electroluminescent device (organic EL device) wherein an organic layer having a luminescent or light-emitting region is provided between an anode and a cathode.

Lightweight, highly efficient flat panel displays have been extensively studied and developed, for example, for picture display of computers and television sets.

Since cathode-ray tubes (CRT) are high in luminance and exhibit good color reproducibility, they are most widely employed for display at present. Nevertheless, the problems are involved in that the tubes are bulky, heavy and high in power consumption.

For lightweight, highly efficient flat panel displays, there have now been put on the market liquid crystal displays of the active matrix drive type. However, liquid crystal displays have the problems that their angle of field is narrow, they do not rely on spontaneous light and thus, need great power consumption for back light when placed in a dark environment, and they do not have a satisfactory response to high-speed video signals of high fineness which have been expected as being in practical use in future. Especially, a difficulty is involved in making a liquid crystal display with a large picture plane size, along with a problem on its high production costs.

As a substitute therefor, a display of the type using a light-emitting diode may be possible, but such a display is also high in production costs, coupled with another problem that it is difficult to form a matrix structure of light-emitting diodes on one substrate. Thus, when considered as a candidate for a low-cost display used in place of CRTs, this type of display has a great problem to solve before putting to practical use.

As a flat panel display which has the possibility of solving these problems, attention has been recently paid to organic electroluminescent devices (organic EL devices) using organic luminescent materials. More particularly, when using organic compounds as a luminescent material, it has been expected to realize a flat panel display, which makes use of spontaneous light, has a high response speed and has no dependence on an angle of field.

The organic electroluminescent device is so arranged that an organic thin film, which contains a luminescent material capable of emitting light through charge of an electric current, is formed between an optically transparent anode and a metallic cathode. In the research report published in Applied Physics Letters, Vol. 51, No. 12, pp. 913–915 (1987), C. W. Tang and S. A. VanSlyke set forth a device structure (an organic EL device having a single hetero structure), which has a double-layered structure including, as organic thin films, a thin film composed of a hole transport material and a thin film composed of an electron transport material. In the device, luminescence occurs by re-combination of holes and electrons injected from the respective electrodes into the organic films.

In this device structure, either of the hole transport material or the electron transport material serves also as a luminescent material. Luminescence takes place in a wavelength band corresponding to the energy gap between the ground state and the energized state of the luminescent material. When using such a double-layered structure, a drive voltage can be remarkably reduced, along with an improved luminescent efficiency.

Since then, there has been developed a three-layered structure (organic EL device having a double hetero structure) of a hole transport material, a luminescent material and an electron transport material as set out in the research report of C. Adachi, S. Tokita, T. Tsutsui and S. Saito, published in Japanese Journal of Applied Physics, Vol. 27, No. 2, pp. L269–L271 (1988). Moreover, a device structure comprising a luminescent material present in an electron transport material has been developed as set out in the research report of C. W. Tang, S. A. VanSlyke and C. H. Chen published in Journal of Applied Physics, Vol. 65, No. 9, pp. 3610–3616 (1989). Through these researches, evidence has been given to the possibility of luminescence of high luminance at low voltage, thus leading to recent, very extensive studies and developments.

Organic compounds used as a luminescent material are considered to be advantageous in that because of their diversity in kind, a luminescent color can be arbitrarily changed theoretically by changing their molecular structure. Accordingly, it may be easier in comparison with thin film EL devices using inorganic materials to provide, via proper molecular design, three colors of R (red)), G (green) and B (blue) having good color purities necessary for full color displays.

However, organic electroluminescent devices still have problems to solve. More particularly, a difficulty is involved in the development of a stable red luminescent device with high luminance. In an instance of red luminescence attained by doping DCM [4-dicyanomethylene-6-(p-dimethylaminostyryl)-2-methyl-4H-pyran] in tris(8-quinolinol)aluminium (hereinafter abbreviated as $Alq_3$) for use as a currently reported electron transport material, this is not satisfactory as a display material with respect to both maximum luminance and reliability.

BSB-BCN, which was reported by T. Tsutsui and D. U. Kim in the meeting of Inorganic and Organic Electroluminescence (at Berlin, 1996), is able to realize a luminance as high as 1000 $cd/m^2$ or over, but is not always perfect with respect to the chromaticity for use as a red color for full color display.

It is now demanded how to realize a red luminescent device which is high in luminance, stable and high in color purity.

In Japanese Patent Laid-open No. Hei 7-188649 (Japanese Patent Application No. Hei 6-148798), it has been proposed to use a specific type of distyryl compound as an organic electroluminescent material. However, the intended luminescent color is blue, not red.

SUMMARY OF THE INVENTION

An object of the invention is to provide an organic electroluminescent device, which ensures a high luminance and stable red luminescence.

Intensive studies have been made in order to solve the above-stated problems of the prior art, and as a result, it has been found that when using a specific type of styryl compound as a luminescent material, there can be provided a highly reliable red luminescent device, which is very useful for realizing a stable full color display of high luminance.

More particularly, there is provided, according to the invention, an organic electroluminescent device of the type which comprises an organic layer which has a luminescent region and is provided between an anode and a cathode and which contains, as an essential component, an organic material capable of generating luminescence by application of an electric current, wherein the organic layer contains, as an organic luminescent material, at least one julolidyl-substituted styryl compound represented by the following general formula [I] or [II]:

General Formula [I]:

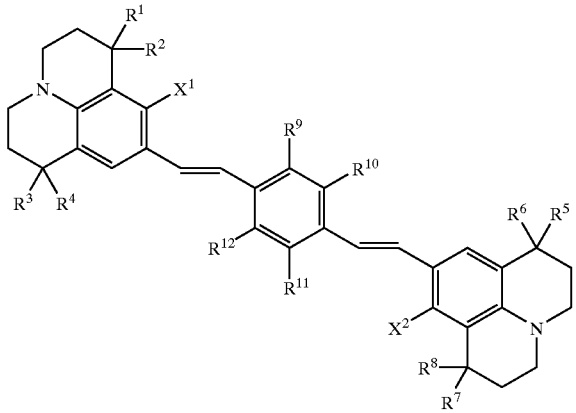

General Formula [II]:

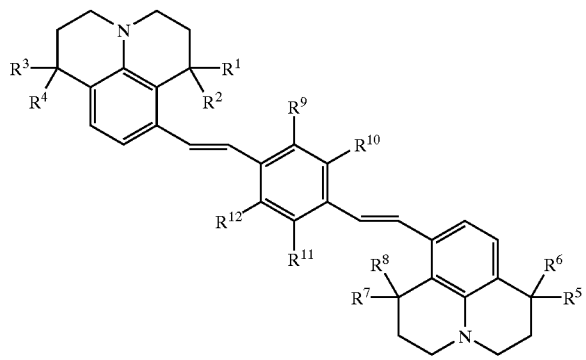

wherein $X^1$ and $X^2$ may be the same or different and, respectively, represent a hydrogen atom, a hydroxyl group or a saturated or unsaturated, unsubstituted or substituted alkoxyl group, which preferably has 1 to 6 carbon atoms, e.g., a methoxy group, an ethoxy group, a methoxymethoxy group or the like, an alkyl group, which preferably has 1 to 6 carbon atoms, e.g., a methyl group, an ethyl group or the like, an amino group, an alkylamino group, which preferably has 1 to 6 carbon atoms, e.g., a methylamino group, an ethyl amino group or the like, or a substituted or unsubstituted aryl group such as a phenyl group, a naphthyl group or the like, and $R^1$, $R^2$, $R^3$, $R^4$, $R^5$, $R^6$, $R^7$ and $R^8$ may be the same or different and independently represent a lower alkyl group, which preferably has 1 to 6 carbon atoms, e.g., a methyl group, an ethyl group or the like, $R^9$, $R^{10}$, $R^{11}$ and $R^{12}$ may be the same or different and at least one of them represents an electron attracting group, i.e., at least one of them represents a cyano group, a nitro group or a halogen atom such as a chlorine atom, a fluorine atom or the like.

The use, as a luminescent material, of the julolidyl-substituted styryl compound of the above general formula [I] or [II] enables one not only to obtain stable red luminescence of high luminance, but also to provide a device which has electrically, thermally or chemically excellent stability. The styryl compounds of the general formula [I] and [II] may be used singly or in combination.

DETAILED DESCRIPTION OF THE PREFERRED EMBODIMENTS

Figure 1:
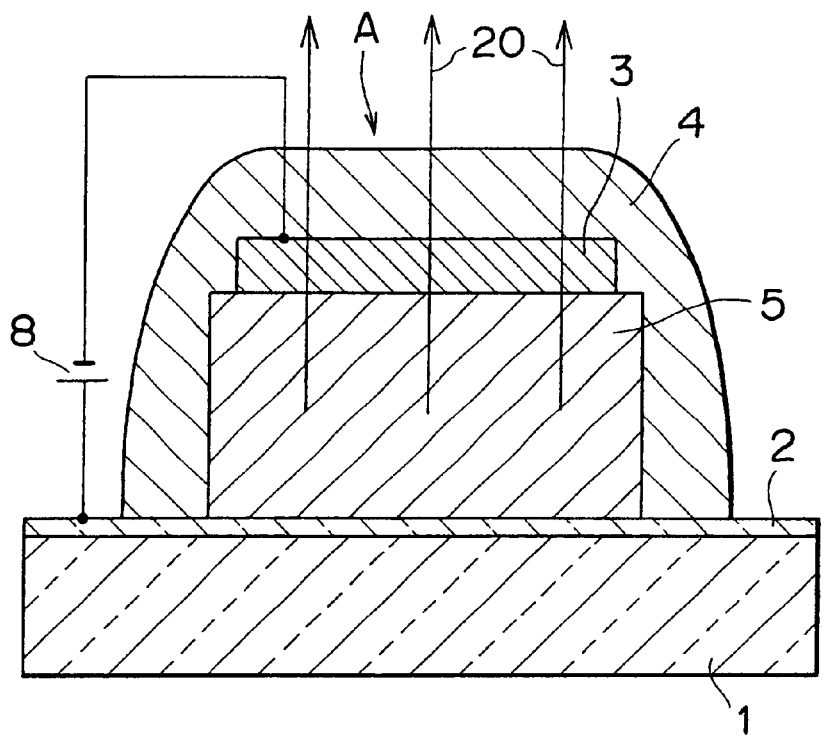
FIG. 1 is a schematic sectional view showing an essential part of an organic electroluminescent device according to one embodiment of the invention.

The julolidyl-substituted styryl compounds used in the organic electroluminescent device of the invention are now described.

The styryl compound represented by the general formula [I] or [II] and used as a luminescent material in the organic electroluminescent device of the invention may consist of at least one compound, which has a molecular structure, for example, of the following structural formula (1)-1, (1)-2, (1)-3, (1)-4, (1)-5, (1)-6, (1)-7 or (1)-8.

Structural Formula (1)-1:
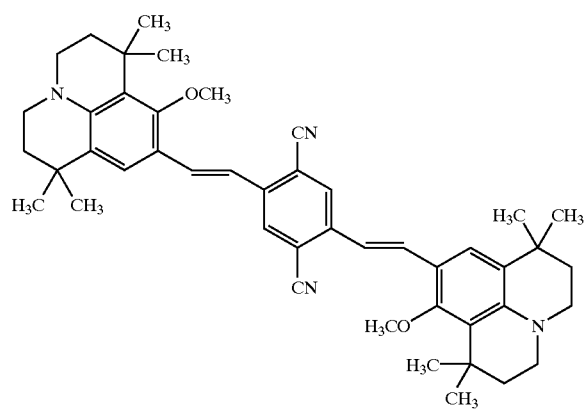
A Structural Formula (1)-2:
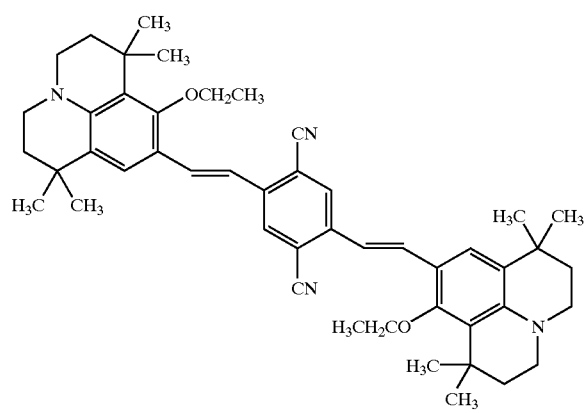
Structural Formula (1)-3:
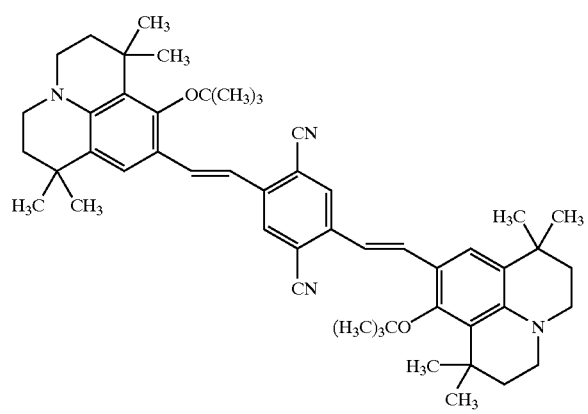
Structural Formula (1)-4:
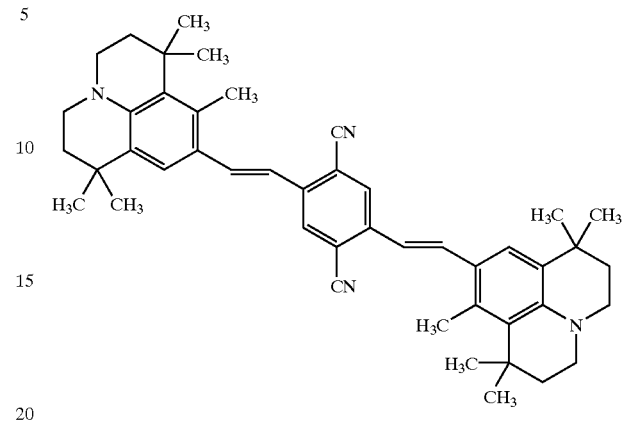
Structural Formula (1)-5:
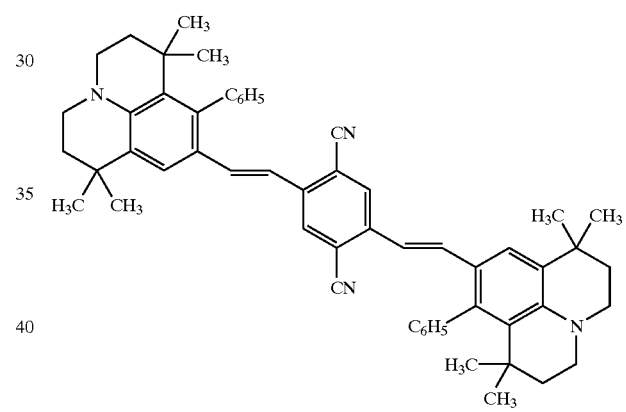
Structural Formula (1)-6:
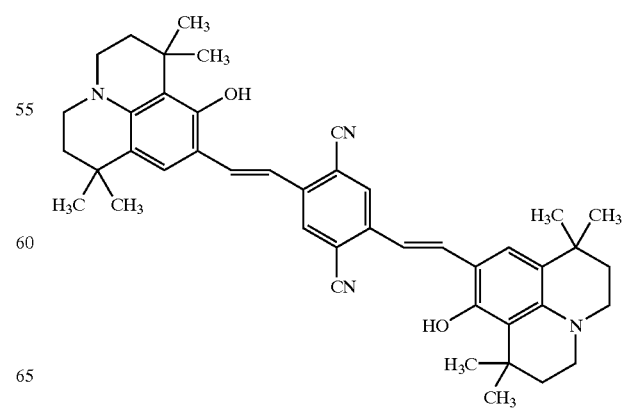

Structural Formula (1)-7:

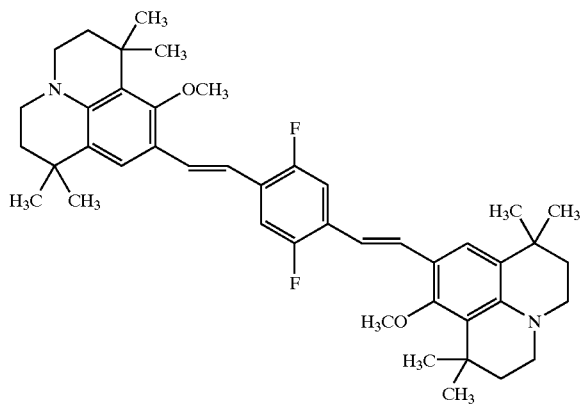

Structural Formula (1)-8:

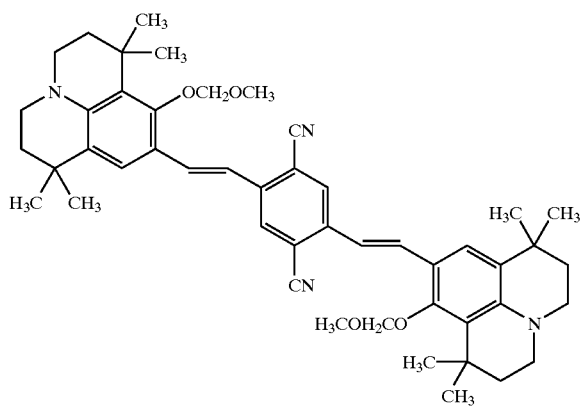

FIGS. 1 to 4, respectively, show examples of organic electroluminescent devices according to the invention, in which like reference numerals indicate like parts or members, respectively.

Figure 2:
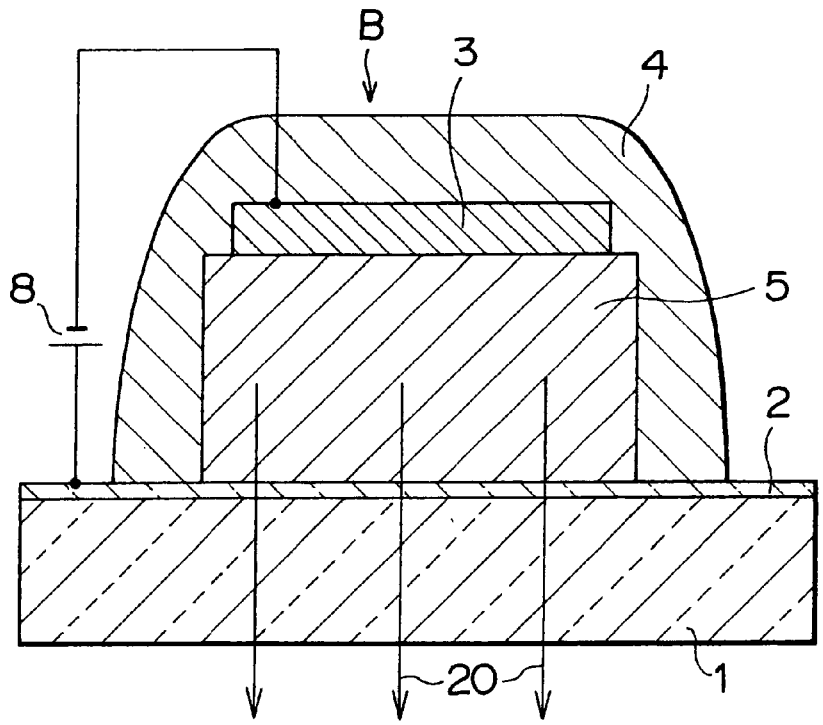
FIG. 2 is a schematic sectional view showing an essential part of an organic electroluminescent device according to another embodiment of the invention.

FIG. 1 shows organic electroluminescent device A of a transmission type in which luminescent light 20 passes through a cathode 3, and the light 20 can also be observed from a side of-a protective layer 4. FIG. 2 shows organic electroluminescent device B of a reflection type wherein light reflected at the cathode 3 can also be obtained as luminescent light.

In the figures, reference numeral 1 indicates a substrate for forming an organic electroluminescent device, which may be made of glass, plastics and other appropriate materials. Where the organic electroluminescent device is used in combination with other types of display devices, the substrate 1 may be commonly used. Reference numeral 2 indicates a transparent electrode (anode), for which ITO (indium tin oxide), $SnO_2$ or the like may be used.

Reference numeral 5 indicates an organic luminescent layer, which contains the above-mentioned julolidyl-substituted styryl compound as a luminescent material. For a layer arrangement for obtaining organic electroluminescence 20, the luminescent layer 5 may have hitherto known various types of layer arrangements. As is described hereinafter, if a material for either a hole transport layer or an electron-transport layer has luminescent properties, for example, a built-up structure of these thin films may be used. Further, in order to increase charge transportability within a range satisfying the purposes of the invention, either or both of a hole transport layer and an electron transport layer have a built-up structure of thin films made of plural types of materials, or a thin film composed of a mixture of plural types of materials may be used without limitation. In addition, in order to improve luminescent properties, at least one fluorescent material may be used to provide a structure wherein the thin film of the fluorescent material is sandwiched between the hole transport layer and the electron transport layer. Alternatively, another type of structure may be used wherein at least one fluorescent material is present in the hole transport layer or in the electron transport layer, or in both of them. In these cases, in order to improve a luminescent efficiency, a thin film for controlling the transport of holes or electrons may be incorporated in the layer arrangement.

The julolidyl-substituted styryl compound represented by the structural formula (1) has both electron transportability and hole transportability, and can be used as a luminescent layer serving also as an electron transport layer, or as a luminescent layer serving as a hole transport layer in the device arrangement. Moreover, it is possible to provide an arrangement wherein the julolidyl-substituted styryl compound is formed as the luminescent layer sandwiched between the electron transport layer and the hole transport layer.

It will be noted that in FIGS. 1 and 2, reference numeral 3 indicates a cathode, and an electrode material may be made of an alloy of an active metal, such as Li, Mg, Ca or the like, and a metal, such as Ag, Al, In or the like, or a built-up structure of thin films of these metals may also be used. In the transmission-type organic electroluminescent device, the optical transmission required for an intended application can be obtained by controlling a cathode thickness. In the figures, reference numeral 4 indicates a sealing/protective layer, and when an organic electroluminescent device is wholly covered therewith, its effect increases. Appropriate materials may be used for this provided that air tightness is ensured. Reference numeral 8 indicates a drive power supply for current charge.

In the organic electroluminescent device of the invention, the organic layer may have an organic built-up structure (single hetero structure) wherein a hole transport layer and an electron transport layer are built up and wherein the above-mentioned julolidyl-substituted styryl compound can be used as a material for forming the hole transport layer or electron transport layer. Alternatively, the organic layer may have an organic built-up structure (double hetero structure) wherein a hole transport layer, a luminescent layer and an electron transport layer are successively built up, and the luminescent layer can be formed of the above-mentioned julolidyl-substituted styryl compound.

An example of the organic electroluminescent device having such an organic built-up structure is shown. More particularly, FIG. 3 shows an organic electroluminescent device C having a single hetero structure which consists of a built-up structure comprising, on an optically transparent substrate 1, an optically transparent anode 2, an organic layer 5a consisting of a hole transport layer 6 and an electron transport layer 7, and a cathode 3 superposed successively in this order, and the built-up structure is sealed with the protective layer 4.

Figure 3:
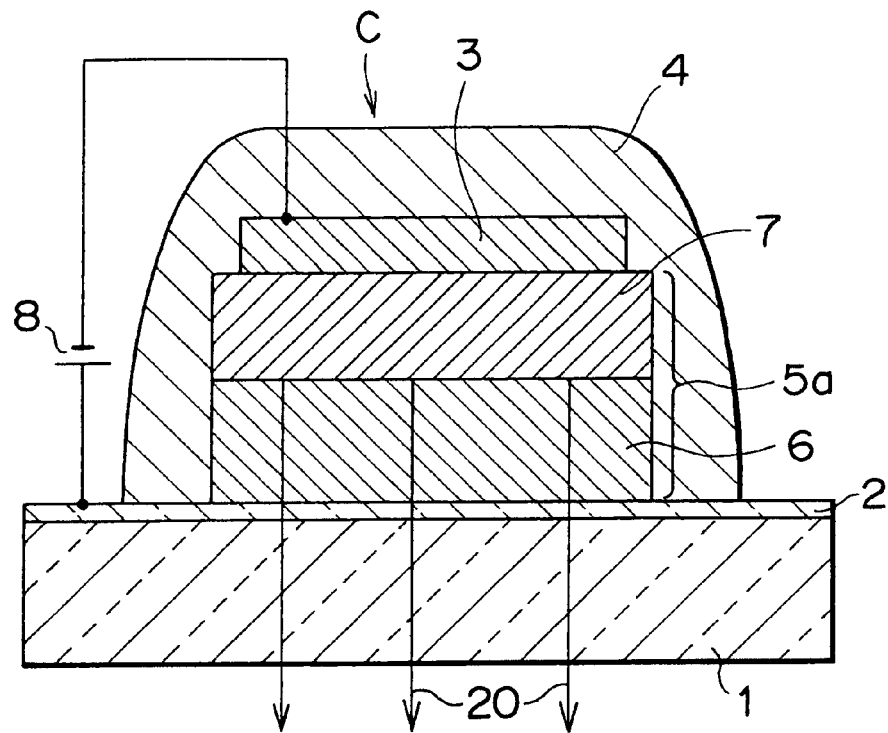
FIG. 3 is schematic sectional view showing an essential part of an organic electroluminescent device according to a further embodiment of the invention.

With such a layer arrangement as shown in FIG. 3 wherein a luminescent layer is omitted, luminescent light 20 with a given wavelength is emitted from the interface between the hole transport layer 6 and the electron transport layer 7. This light is observed from the side of the substrate 1.

Figure 4:
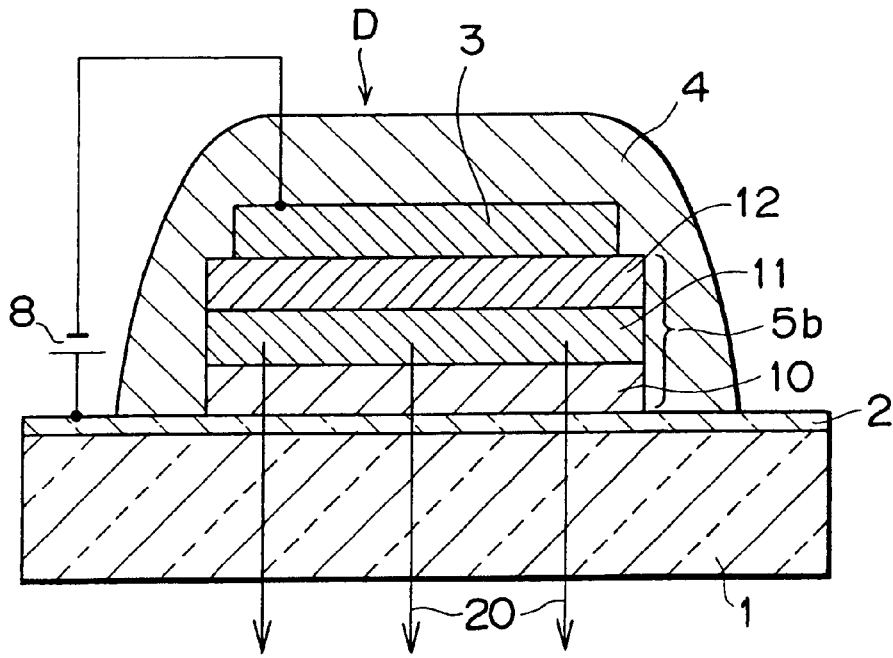
FIG. 4 is a schematic sectional view showing an essential part of an organic electroluminescent device according to a still further embodiment of the invention.

FIG. 4 shows an organic electroluminescent device D having a double hetero structure which consists of a built-up structure comprising, on an optically transparent substrate 1, an optically transparent anode 2, an organic layer 5b consisting of a hole transport layer 10, a luminescent layer 11 and an electron transport layer 12, and a cathode 3 superposed successively in this order. The built-up structure is sealed with a protective layer 4.

In the organic electroluminescent device shown in FIG. 4, when a DC voltage is applied between the anode 2 and the cathode 3, the holes injected from the anode 2 arrive at the luminescent layer 11 via the hole transport layer 10, and the electrons injected from the anode 3 also arrive at the luminescent layer 11 via the electron transport layer 12. Eventually, the electrons/the holes are re-combined in the luminescent layer to generate singlet excitons, thereby causing light with a given wavelength to be generated from the singlet excitons.

In the above-stated organic electroluminescent devices C and D, optically transparent materials such as, for example, glass, plastics and the like may be appropriately used as the substrate 1. Where the devices are used in combination with other types of display devices, or where the built-up structures shown in FIGS. 3 and 4 are arranged in the form of a matrix, the substrate may be commonly used. Both of the devices C and D may have a structure of either a transmission type or a reflection type.

The anode 2 consists of a transparent electrode, for which ITO (indium tin oxide), $SnO_2$ or the like may be used. In order to improve a charge injection efficiency, a thin film made of an organic material or an organometallic compound may be provided between the anode 2 and the hole transport layer 6 (or the hole transport layer 10). It will be noted that where the protective layer 4 is formed of a conductive material such as a metal, an insulating film may be provided at the sides of the anode 2.

The organic layer 5a of the organic electroluminescent device C consists of a built-up organic layer of the hole transport layer 6 and the electron transport layer 7, and the afore-indicated julolidyl-substituted styryl compound may be contained in either or both of these layers to provide a luminescent hole transport layer 6 or electron transport layer 7. The organic layer 5b of the organic electroluminescent device D consists of a built-up organic layer of the hole transport layer 10, the luminescent layer 11 containing such a julolidyl-substituted styryl compound as set out before, and the electron transport layer 12. The layer 5b may take other various types of built-up structures. For instance, either or both of the hole transport layer and the electron transport layer may have luminescent properties.

Especially, it is preferred that the hole transport layer 6 or electron transport layer 7, and the luminescent layer 11, respectively, consist of a layer made of the julolidyl-substituted styryl compound used in the present invention. These layers may be formed of the afore-mentioned julolidyl-substituted styryl compound alone, or may be formed through co-deposition of the julolidyl-substituted styryl compound and other type of hole or electron transport material (e.g., an aromatic amine, a pyrazoline or the like). Moreover, in order to improve the hole transportability in the hole transport layer, a hole transport layer, which consists of a plurality of hole transport materials being built up, may be formed.

In the organic electroluminescent device C, the luminescent layer may be the electron transport luminescent layer 7. In this case, light may be emitted from the hole transport layer 6 or its interface depending on the voltage applied to from a power supply 8. Likewise, in the organic electroluminescent device D, the luminescent layer may be, aside from the layer 11, the electron transport layer 12 or the hole transport layer 10. For improving the luminescent performance, it is preferred to provide a structure wherein the luminescent layer 11 containing at least one fluorescent material is sandwiched between the hole transport layer and the electron transport layer. Alternatively, a fluorescent material may be contained in the hole transport layer or the electron transport layer, or in both layers. In this connection, in order to improve a luminescent efficiency, a thin film (such as a hole blocking layer or an exciton-generating layer) for controlling the transport of holes or electrons may be provided in the layer arrangement.

The materials used as the cathode 3 may be alloys of active metals such as Li, Mg, Ca and the like and metals such as Ag, Al, In and the like, or a built-up structure of the layers of these metals may also be used. Proper selection in cathode thickness and in type of alloy or metal enables one to fabricate an organic electroluminescent device adapted for its application.

The protective layer 4 acts as a sealing film, and is arranged to wholly cover an organic electroluminescent device therewith, thereby ensuring an improved charge injection efficiency and luminescent efficiency. It should be noted that if air tightness is ensured, a material including a single metal such as aluminium, gold, chromium or the like, or an alloy thereof may be appropriately selected for this purpose.

The an electric current applied to the respective organic electroluminescent devices set out hereinabove is usually a direct current, but a pulse current or AC current may also be used. The values of current and voltage are not critical provided that they are within ranges not breaking the devices down. Nevertheless, taking into account the power consumption and life of the organic electroluminescent devices, it is preferred to cause luminescence efficiently by use of an electric energy which is as small as possible.

Figure 5:
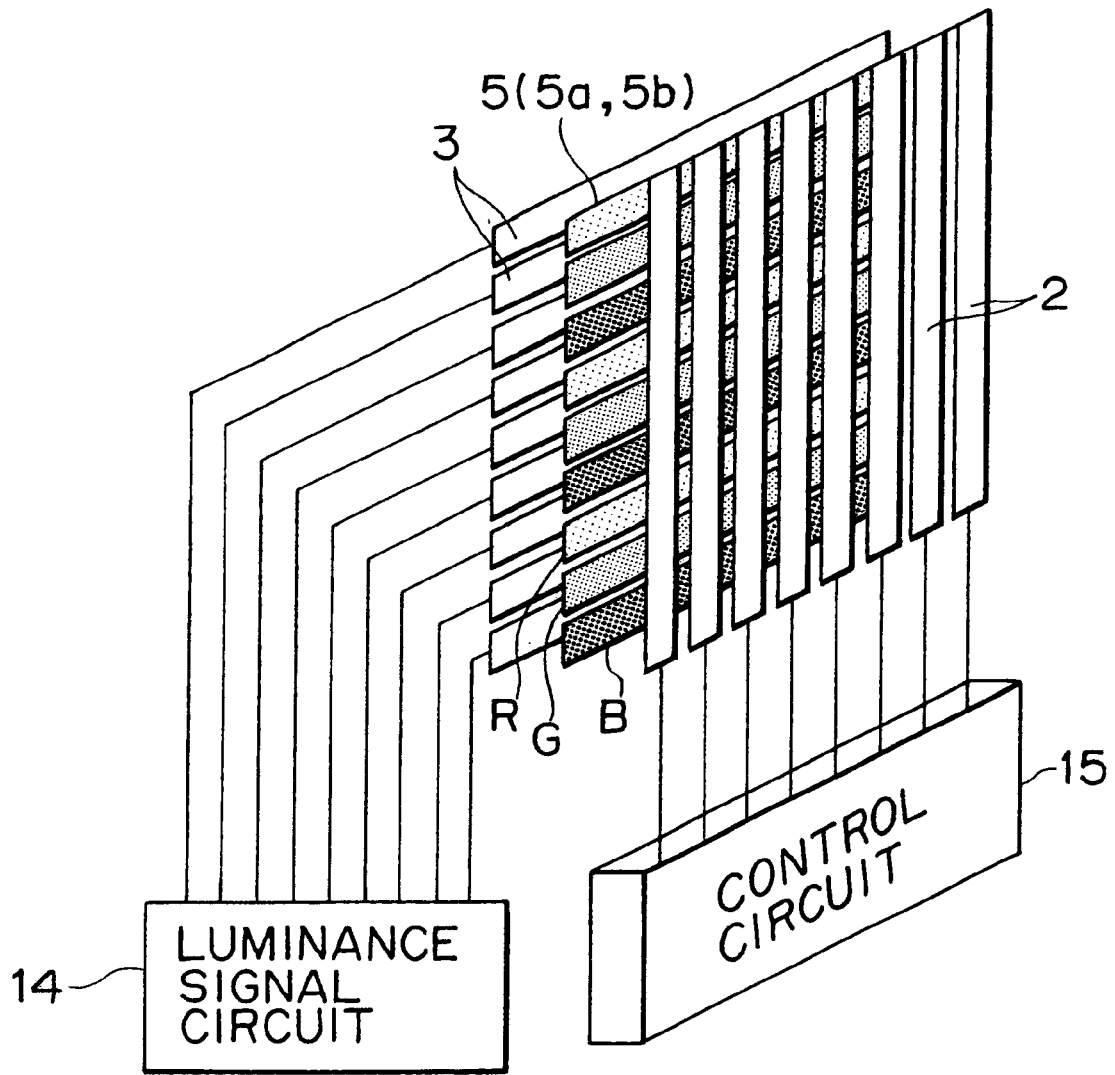
FIG. 5 is a view showing an arrangement of a full color flat display using an organic electroluminescent device of the invention.

Next, FIG. 5 shows an arrangement of a flat display, which makes use of an organic electroluminescent device of the invention. As shown in the figure, with the case, for example, of a full color display, organic layers 5 (5a, 5b) capable of generating luminescent three primary colors of red (R), green (G) and blue (B) are arranged between cathodes 3 and anodes 2. The cathodes 3 and the anodes 2 may be provided in the form of a stripe in which they are mutually intersected, and are properly selected by means of a luminance signal circuit 14 and a shift register built-in control circuit 15 and applied with a signal voltage thereto. As a result, an organic layer at a position (picture element) where the selected cathode 3 and anode 2 are intersected emits light.

More particularly, FIG. 5 shows, for example, an 8×3 RGB simple matrix wherein the organic layer 5 as a built-up body consisting of a hole transport layer and at least one of a luminescent layer and an electron transport layer is provided between the cathodes 3 and the anodes 2 (see FIG. 3 or 4). The cathodes and anodes are patternized in the form of a stripe and are mutually intersected in a matrix, to which signal voltages are applied in time series from the shift register built-in control circuits 15 and 14, thereby causing electroluminescence or light emission at the intersected position. The EL device having such an arrangement may be used not only as a display for letters/symbols, but also as an image reproducing apparatus. Moreover, the striped patterns of the anodes 3 and the cathodes 2 may be arranged for each of red (R), green (G) and blue (B) colors, thus making it possible to fabricate a solidstate flat panel display of the multicolor or full color type.

For the preparation of the julolidyl-substituted styryl compound in a high efficiency, a formulated julolidyl compound of the general formula [III] or [IV] are reacted with a diphosphonic acid ester of the following general formula [V] or a diphosphonium compound of the following general formula [VI], thereby obtaining. the julolidyl-substituted styryl compound of the afore-indicated general formula [I] or [II]:

General Formula [III]:

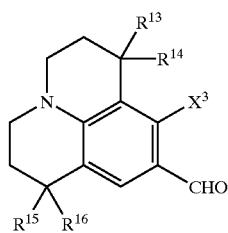

General Formula [IV]:

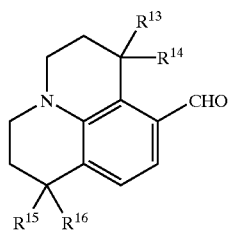

wherein $X^3$ represents a hydrogen atom, a hydroxyl group, an alkoxyl group, an alkyl group, an amino group, an alkylamino group, or a substituted or unsubstituted aryl group corresponding to $X^1$ and $X^2$ defined before, respectively, $R^{13}$, $R^{14}$, $R^{15}$ and $R^{16}$, respectively, represent a lower alkyl group corresponding to $R^1$, $R^2$, $R^3$, $R_4$, $R^5$, $R^6$, $R^7$ and $R^8$ defined before and may be the same or different;

General Formula [V]

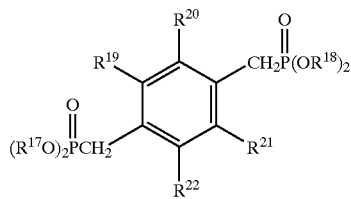

General Formula [VI]:

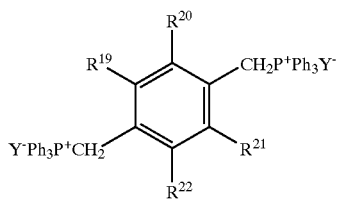

wherein $R^{17}$ and $R^{18}$ may be the same or different and independently represent a hydrocarbon group, $R^{19}$, $R^{20}$, $R^{21}$ and $R^{22}$ respectively, represent an electron attracting group corresponding to $R^9$, $R^{10}$, $R^{11}$ and $R^{12}$ defined before and may be the same or different, and Y represents a halogen atom such as a chlorine atom.

More specifically, in the method of preparing the julolidyl-substituted styryl compound, the reaction (condensation) is carried out by the Wittig-Horner reaction or the Wittig reaction wherein the diphosphonic acid ester and/or the diphosphonium compound is treated with a base in a solvent to form a carbanion, and the carbanion is condensed with the formulated julolidyl compound.

The reaction scheme of the condensation reaction can be shown, for example, by the following Reaction Scheme 1 or 1'.

Reaction Scheme 1:

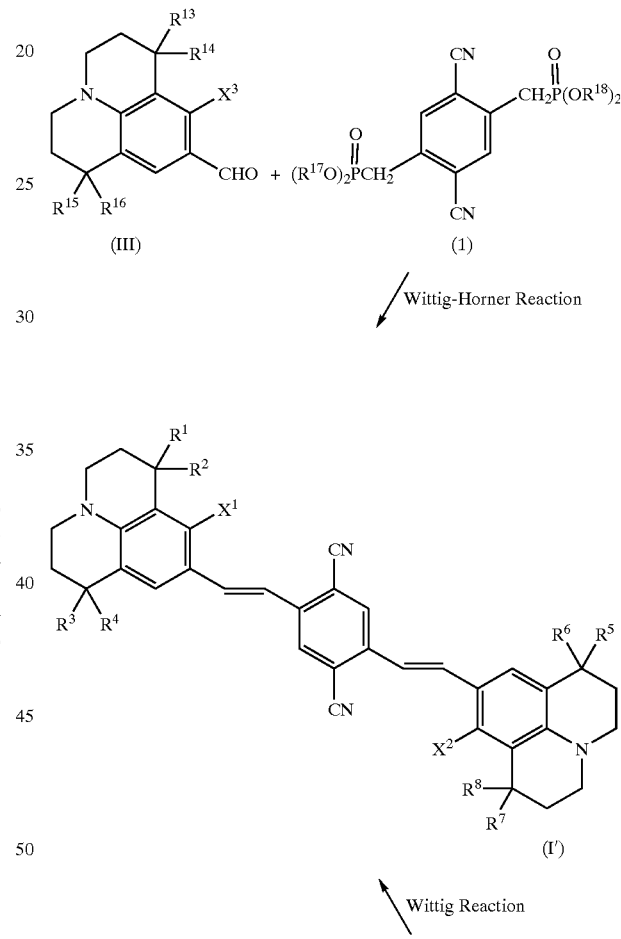

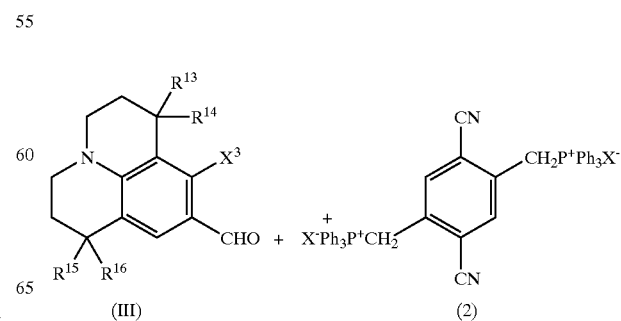

Reaction Scheme 1':

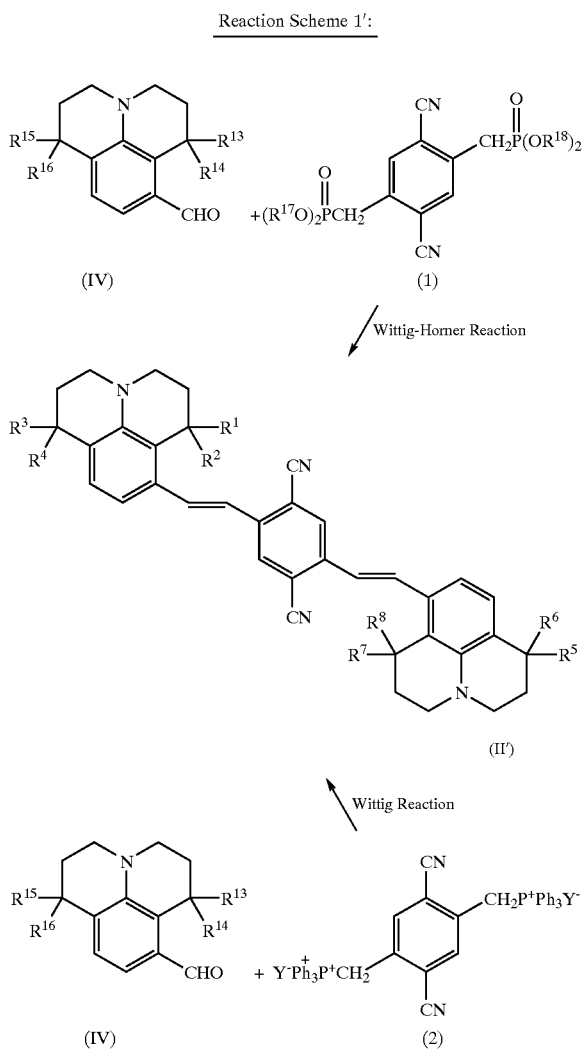

This reaction starts with the formation of a carbanion by treating the compound of the general formula (1) or (2) with a base in an appropriate solvent, and completes with the condensation of the carbanion with an aldehyde of the general formula [III] or [IV]. The combinations of a base and a solvent are considered to be ones including sodium hydroxide/water, sodium carbonate/water, potassium carbonate/water, sodium ethoxide/ethanol or dimethylformamide, sodium methoxide/methanol-diethyl ether mixed solvent or dimethylformamide, triethylamine/ethanol, diglyme, chloroform or nitromethane, pyridine/methylene chloride or nitromethane, 1,5-diazabicyclo[4.3.0]non-5-en/dimethylsulfoxide, potassium t-butoxide/dimethyl sulfoxide or tetrahydrofuran, butyl lithium/diethyl ether, tetrahydrofuran, benzene or dimethylformamide, phenyl lithium/diethyl ether or tetrahydrofuran, sodium amide/ammonia, sodium hydride/dimethylformamide or tetrahydrofuran, trityl sodium/diethyl ether or tetrahydrofuran, and the like.

The reaction proceeds at a relatively low temperature of −30° C. to 30° C. and is selective, so that the purification of an intended product through chromatography is easy. In addition, the compound of the general formula [I'] or [II'] is so high in crystallinity that the purity can be improved via re-crystallization. The re-crystallization method is not critical, and is simply feasible according a method of dissolving the product in acetone and adding hexane to the solution, with subsequent removal of the solvents by distillation being easy. This reaction may be performed under conditions of a normal temperature to 30° C., a normal pressure and 1 to 2 hours.

It is preferred that the reaction is caused to proceed according to the following reaction formulae to obtain the julolidyl-substituted styryl compound of the following general formula [I'] or [II']:

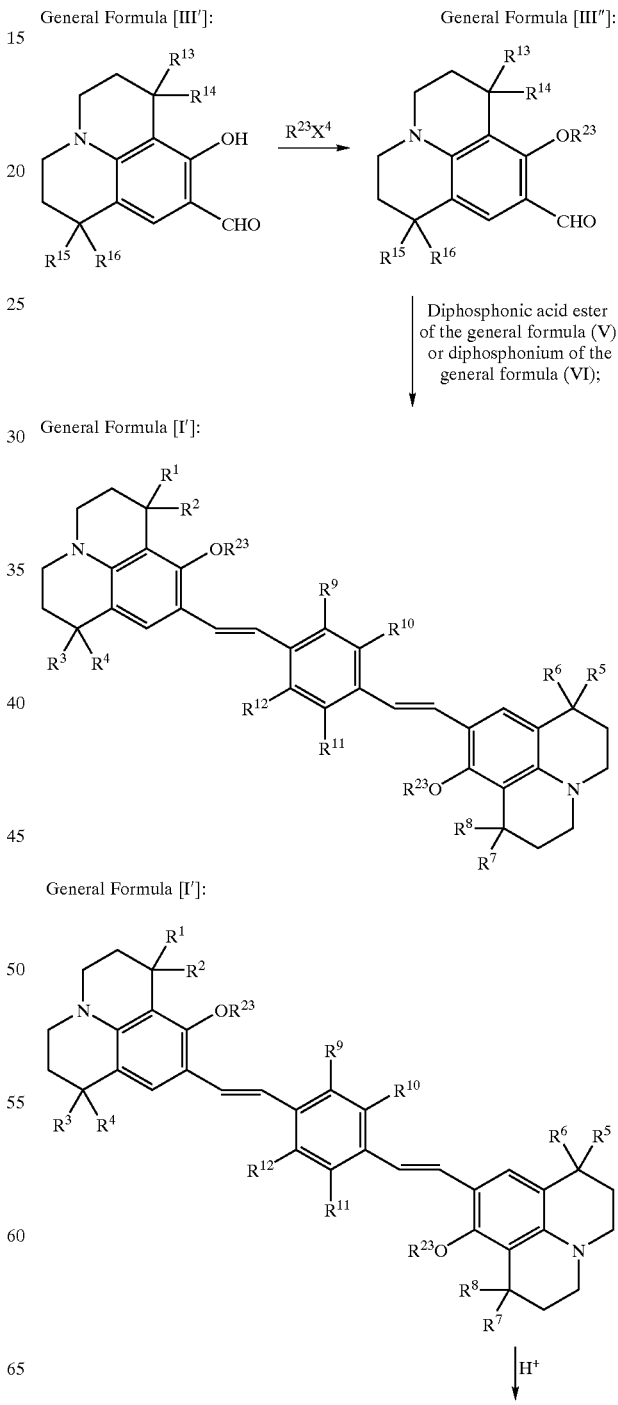

General Formula [I″]:

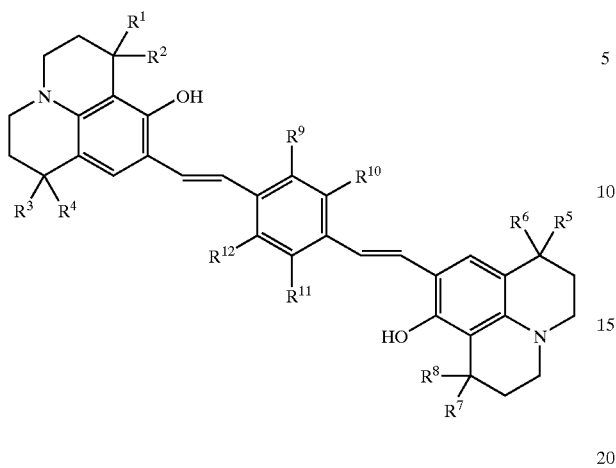

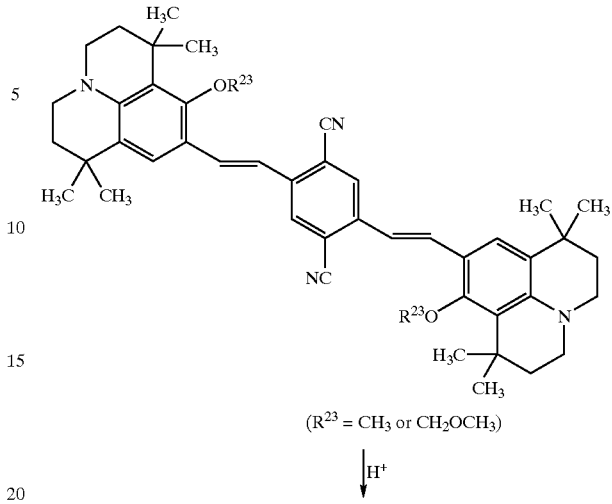

In the general formulae [I′], [I″], [III′] and [III″], $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$ and $R^{16}$, respectively, have the same meanings as defined before, $R^{23}$ represents an alkyl group preferably having 1 to 6 carbon atoms such as a methyl group, an ethyl group or the like, or an alkoxyalkyl group preferably having 2 to 6 carbon atoms such as a methoxymethyl group or the like, and $X^4$ represents a halogen atom such as, for example, a chlorine atom, an iodine atom or the like.

The reaction is more particularly shown below:

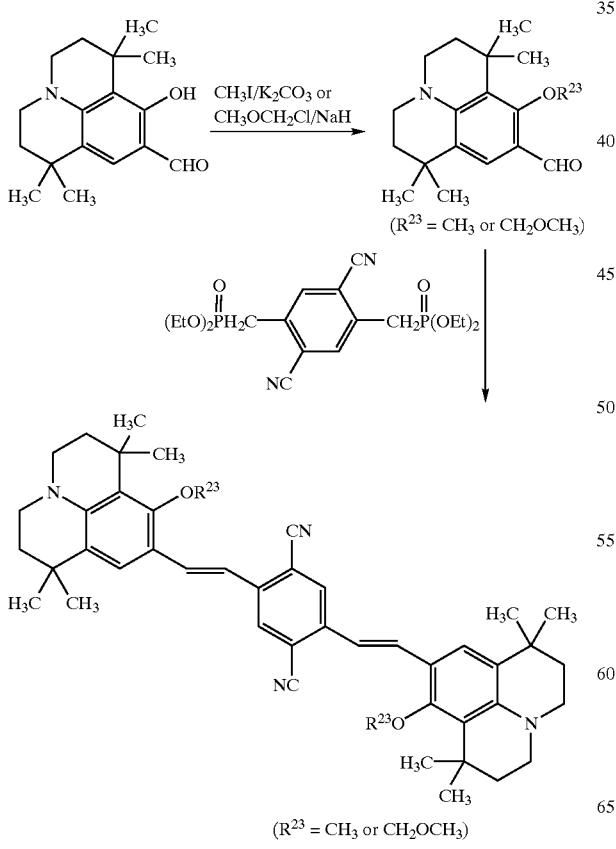

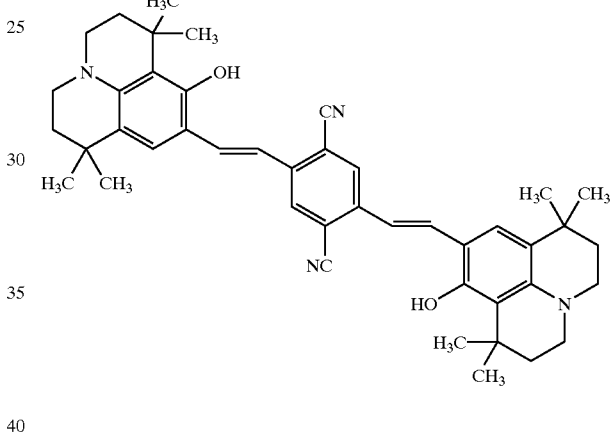

It is preferred that the reaction for obtaining the compound of the general formula [I′] from the compound of the general formula [III′] is conducted according to the Wittig-Horner reaction or the Wittig reaction wherein the diphosphonic acid ester and/or the diphosphonium compound is treated with a base in a solvent thereby forming a carbanion. The thus formed carbanion is condensed with the compound of the general formula [III′], and the compound of the general formula [I′] obtained through the condensation is hydrolyzed with a strong acid such as HCl to obtain the compound of the general formula [I″].

In the above reactions, the hydroxyl group (OH) of the compound of the general formula [III′] is protected through etherification with an alkyl group or the like ($R^{23}$), under which the Wittig-Horner reaction or Wittig reaction is carried out, and the ether moiety is finally hydrolyzed. Thus, the compound of the general formula [I″] can be reliably synthesized in high yield. If $R^{23}=CH_2OCH_3$, the hydrolysis proceeds readily.

It will be noted that the formulated julolidyl compound of the following general formula [IV], which is a synthetic intermediate of the julolidyl-substituted styryl compound, is a novel compound General Formula [IV]:

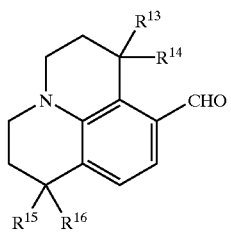

wherein $R^{13}$, $R^{14}$, $R^{15}$ and $R^{16}$, respectively have the same meanings as defined before This synthetic intermediate can be prepared from its precursor in the following manner.

More particularly, the julolidyl compound of the general formula [VII] is formulated by means of an adduct of dimethylformamide and a halogenated phosphoryl compound to obtain the formulated julolidyl compound of the general formula [IV]. This formulation reaction can be carried out in dimethylformamide at a temperature of room temperature (20° C.) to 80° C. at a normal pressure for 2 to 24 hours General Formula [VII]:

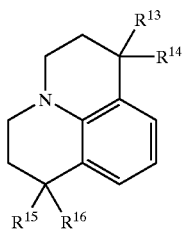

wherein $R^{13}$ $R^{14}$, $R^{15}$ and $R^{16}$, respectively have the same meanings as defined before.

In this case, it is preferred that aniline or an m-substituted aniline of the following general formula and a 1-halogenated-3,3-dialkyl-2-propene are reacted with each other, and the resultant 3-[N,N-bis(3,3-dialkyl-2-[propenyl] amine salt is further reacted with a alkylsulfonic acid. The resulting 1,1,7,7-tetraalkyljulolidine alkylsulfonate is neutralized with an alkali, followed by formulation of the resultant 1,1,7,7-tetraalkyljulolidine General Formula:

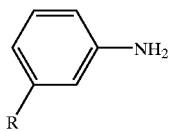

wherein R represents a hydrocarbon group, a halogen atom, an alkoxyl group or the like.

The compound (1) or (2) serving as the synthetic intermediate can be derived from a synthetic intermediate used as its precursor in the following manner.

The halogenated aryl compound of the following general formula [VIII] and an trialkyl phosphite of the following general formula [IX] or triphenylphosphine (PPh$_3$) are reacted with each other, to obtain, as a synthetic intermediate, a diphosphonic acid ester or diphosphonium of the afore-indicated general formula (1) or (2) This reaction is effected in a solvent-free condition, in an excess of the trialkyl phosphite or in a solvent such as xylene or the like at a reaction temperature of 120 to 160° C. at a normal pressure for a reaction time of 30 minutes to 12 hours:

General Formula [VIII]:

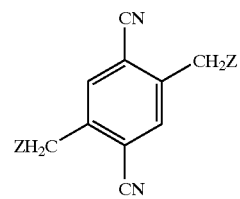

wherein Z represents a halogen atom; and

General Formula [IX]:

$$P(OR^{24})_3 \text{ or } P(OR^{25})_3$$

wherein $R^{24}$ and $R^{25}$ may be the same or different and independently represent a hydrocarbon group, preferably a saturated or unsaturated hydrocarbon group having from 1 to 4 carbon atoms and correspond to $R^{17}$ or $R^{18}$, respectively.

The above scheme 1 or 1' is more particularly described in the order of the following steps (a) to (e).

(a) 2,5-Dimethylterephthalonitrile is brominated to prepare 2,5-diboromomethylterephthalonitrile.

(b) This compound is reacted with triethyl phosphite under reflux to prepare a diphosphonic acid ester (1).

(c) On the other hand, aniline or an m-substituted aniline is mixed with N,N-dimethylformamide or calcium carbonate, to which a 1-chloro-3,3-dialkyl-2-propene is added at 80° C. or below, followed by gentle addition of water to permit a 3-[N,N-bis(3,3-dialkyl-2-propenyl) amine hydrochloride salt to be precipitated.

(d) The salt is reacted with an alkylsulfonic acid to obtain a 1,1,7,7-tetraalkyljulolidine alkylsulfonate. This salt is neutralized with sodium hydroxide. The resultant 1,1,7,7-tetraalkyljulolidine is reacted with a phosphoryl chloride solution in N,N-dimethylformamide (DMF) to obtain, as a major product, 1,1,7,7-tetraalkyljulolidine-9-carbaldehyde [III] and, as a minor product, 1,1,7,7-tetraalkyljulolidine-6-carbaldehyde [IV].

(e) Next, the 1,1,7,7-tetraalkyljulolidine-9-carbaldehyde [III] (including one which undergoes an alkoxy substitution at the 8 position) or 1,1,7,7-tetraalkyljulolidine-8-carbaldehyde [IV] and the phosphoric acid ester (1) are subjected to the Wittig-Horner reaction (i.e., treated with sodium hydride in tetrahydrofuran), thereby obtaining an intended julolidyl-substituted styryl compound [I'].

The invention is more particularly described by way of examples, which should not be construed as limiting the invention thereto.

Synthetic intermediates, which are used to prepare a julolidyl-substituted styryl compound employed to make an organic electroluminescent device, were prepared in a manner as exemplified below.

2,5-Dibromomethylterephthalonitrile (3)

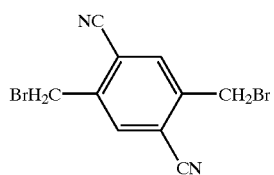
(3)

3.02 g (20 mmol) of 2,5-dimethylterephthalonitrile in 100 ml of benzene was refluxed at 100° C. along with 35.50 g (100 mmol) of N-bromosuccinimide until the reaction was completed. The re-crystallization from acetone/hexane resulted in 2.00 g (yield: 33%) of a pure product (3) as a light white solid.

The analytical data of this product are shown below.

$^1$H NMR (400 MHz, CDCl$_3$): δ 4.6 ppm (s, 4H, 2CH$_2$), 7.9 ppm (s, 2H, aromatics)

Diphosphonic Acid Ester (1)

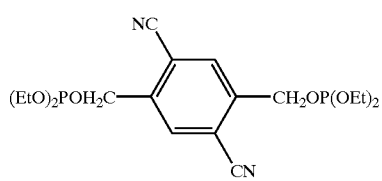
(1)

1.20 g (3.8 mmol) of the above 2,5-dibromomethylterephthalonitrile (3) was refluxed at 125° C. for 2 hours along with 5 ml of triethyl phosphite. The excess triethyl phosphite was removed under reduced pressure. The diphosphonic acid ester (1) was obtained as light yellow crystals through re-crystallization from acetone/hexane.

The analytical data of this product are shown below. $^1$H NMR (400 MHz, CDCl$_3$): δ 1.2 ppm (t, 12H, 4CH$_3$), 3.2 ppm (d, 4H, 2CH$_2$), 4.1 ppm (m, 8H, 4CH$_2$), 7.9 ppm (s, 2H, aromatics)

8-Hydroxy-1,1,7,7-tetraalkyl (e.g. Methyl)julolidine-9-carbaldehyde (4)

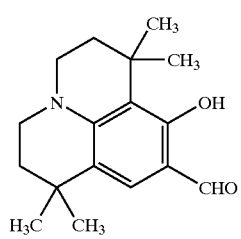
(4)

This aldehyde reagent (4) is commercially available based on Acros Organics Catalogue of Fine Chemicals and was used without purification.

8-Alkoxy (e.g. Methoxy)-1,1,7,7-tetralkyl (e.g. Methyl) julolidine-9-carbaladehyde (5a)

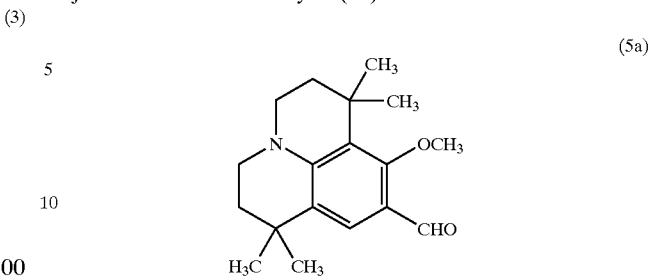
(5a)

3.00 g (11.0 mmol) of 8-hydroxy-1,1,7,7-tetramethyljulolidine-9-carbaldehyde and 15.2 g (110 mmol) of potassium carbonate were suspended in 300 ml of acetone and refluxed. 10.4 g (73.2 mmol) of methyl iodide was added to the suspension in every 90 minutes after division into four portions, followed by refluxing for 12 hours.

The reaction solution was cooled down to room temperature, and the resultant insoluble matter was removed by filtration. The filtrate was concentrated, and isolated for purification through silica gel chromatography (Wakogel C-300, tetrahydrofuran:hexane=1:2). The resultant eluate was concentrated and recrystallized from acetone-hexane to obtain 2.98 g (yield: 94%) of 8-methoxy-1,1,7,7-tetramethyljulolidine-9-Carbaldehyde (5a).

The analytical data of this product are shown below. $^1$H NMR (270 MHz, CDCl$_3$): δ 1.3 and 1.4 ppm (s, 6H, CH$_3$), 1.7 ppm (m, 2H, CH$_2$), 3.3 ppm (m, 2H, CH$_2$), 3.9 ppm (s, 3H, OCH$_3$), 7.5 ppm (s, H, aromatic), 10.0 ppm (s, 1H, CHO)

8-Methoxymethoxy-1,1,7,7-tetramethyljulolidine-9-Carbaldehyde (5b)

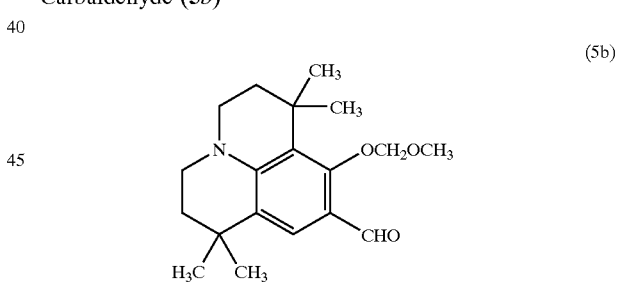
(5b)

52.2 mmol of sodium hydride (60% mineral oil dispersion) was washed twice with a small amount of hexane in an atmosphere of nitrogen, and suspended in 20 ml of dry tetrahydrofuran. A solution of 2.00 g (7.31 mmol) of 8-hydroxy-1,1,7,7-tetramethyljulolidine-9-carbaldehyde (4) dissolved in 20 ml of dry tetrahydrofuran was dropped at 0° C., followed by agitation for 30 minutes as it is. 4.23 g (52.5 mmol) of methoxymethyl chloride was further added to, followed by agitation at room temperature for 4 hours.

The reaction solution was quenched with a small amount of ice pieces on an ice bath, washed with a saturated saline solution and dried over sodium sulfate. 8-methoxymethoxy-1,1,7,7-tetramethyljulolidine-9-carbaldehyde (5b) was obtained at a yield of 50% by isolation through silica gel chromatography (Wakogel C-200, tetrahydrofuran).

The analytical data of this product are shown below. $^1$H NMR (270 MHz, DMSO-d$_6$): δ 1.4 ppm (s, 6H, CH$_3$), 1.7 ppm (m, 2H, CH$_2$), 3.3 ppm (m, 2H, CH$_2$), 3.5 ppm (s, 3H, OCH$_3$), 5.0 ppm (s, 2H, CH$_2$O), 7.4 ppm (s, H, aromatic), 9.7 ppm (s, 1H, CHO)

1,1,7,7-Tetramethyljulolidine-9-carbaldehyde (6)

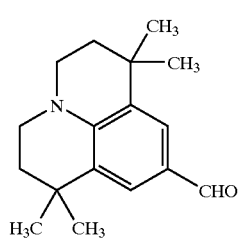

(6)

(a) 3-[N,N-bis(3-methyl-2-buten-1-yl)aminophenyl hydrochloride 100 ml of DMF (dimethylformamide), 23.28 g (0.25 mol) of aniline and 12.5 g (0.125 mol) of calcium carbonate were charged into a 500 ml round bottom flask equipped with a nitrogen introducing pipe, a mechanical stirrer and a 50 ml dropping funnel having a condenser. The resultant mixture was heated to 65° C., to which 53.59 g (0.5 mol) of 1-chloro-methylbutene was fed from the dropping funnel. This alkene was added to while strongly stirring over 15 minutes at a temperature kept at 80° C. or below, followed by further agitation at 80° C. for 40 minutes and cooling down to room temperature by immersion in an ice bath.

While strongly stirring, 100 ml of water was gently added to, followed by passage through a glass filter to remove the resultant precipitate by filtration. The filter cake was washed with diethyl ether (2×40 ml) and dried for 1 hour under suction, followed by further washing with 40 ml of diethyl ether and suction drying at 50° C. for 3 hours. As a result, 30.35 g (yield: 46%) of 3-[N,N-bis(3-methyl-2-buten-1-yl)] aminophenyl hydrochloride as a white solid powder product.

The analytical data of the product are shown below. $^1$H NMR (270 MHz, CDCl$_3$): δ 1.4 and 1.6 ppm (s, 6H, 2CH$_3$), 3.9 ppm (s, 4H, 2CH$_2$), 5.4 ppm (m, 2H, CH=C), 7.3–7.7 ppm (m, 5H, aromatics)

(b) Methylsulfonate of 1,1,7,7-tetramethyljulolidine 25 ml of methanesulfonic acid was charged into a 300 ml round bottom flask equipped with a nitrogen introducing pipe, a-mechanical stirrer and a funnel for powder. 20.2 g of the solid 3-[N,N-bis(3-methyl-2-buten-1-yl)]aminophenyl hydrochloride was added to the acid under strong agitation in 25 minutes. The reaction mixture was heated to 100° C., at which it was maintained for 1 hour. Thereafter, the cooled down to 40° C. on an ice bath, after which it was slowly poured into 100 ml of strongly agitated, ice-cooled water in 15 minutes, followed by extraction with CHCl$_3$ (3×100 ml).

The organic phase was dried over MgSO$_4$ (magnesium sulfate) and filtered, followed by removal of the solvent with a rotary evaporator to obtain the product (methylsulfonate of 1,1,7,7-tetramethyljulolidine) as a viscous brown oil at a quantitative yield.

The analytical data of this product are shown below. $^1$H NMR (270 MHz, CDCl$_3$): δ 1.1–1.9 ppm (m, 12H, 4CH$_3$), 0.9–1.9 ppm (m, 4H, 2CH$_2$), 2.6–2.8 ppm (m, 4H, 2CH$_2$), 7.2–7.8 ppm (m, 3H, aromatics)

(c) 1,1,7,7-Tetramethyljulolidine 29 g (90 mmol) of the 1,1,7,7-tetramethyljulolidine methylsulfonate was slowly added to 50 ml of an aqueous solution of 4.04 g (100 mmol) of sodium hydroxide, strongly agitated. After agitation for 5 minutes, 100 ml of ethyl acetate was added to the mixture, followed by agitation for 30 minutes.

The organic phase was dried over MgSO$_4$ and decolored, followed by filtration and evaporating with a rotary evaporator to obtain 14.5 g (yield: 71%) of a product (1,1,7,7-tetramethyljulolidine) in the form of a brown oily substance.

The analytical data of this product are shown below. $^1$H NMR (270 MHz, CDCl$_3$): δ 1.7 ppm (d, 12H, 4CH$_3$), 2.1 ppm (m, 4H, 2CH$_2$), 3.4–3.9 ppm (m, 4H, 2CH$_2$), 6.5–7.3 ppm (m, 3H, aromatics)

(d) 1,1,7,7-Tetramethyljulolidine-9-carbaldehyde 7 ml of phosphoryl chloride was gently added to 20 ml of N,N-dimethylformamide (DMF) cooled on an ice bath. The resultant light yellow solution was agitated at room temperature for 1 hour. The 1,1,7,7-tetramethyljulolidine obtained above was dropped in the solution in 30 minutes, during which the reaction mixture was changed to a dark red. This mixture was heated to 65° C., at which it was maintained for 3 hours, followed by pouring into strongly agitated water.

The resulting dark rubbery matter was extracted twice with 150 ml of hexane/ethyl acetate (1:1 mixture) and dried over MgSO$_4$ (magnesium sulfate), and the solvent was removed in a rotary evaporator. The product was purified via-column chromatography (silica gel, dichloromethane), followed by extraction with hexane/ethyl acetate (6:1) to obtain a major product (1,1,7,7-tetramethyljulolidine-9-carbaldehyde (6)) at a yield of 54% in the form of an oily substance.

The analytical data of this product are shown below. $^1$H NMR (270 MHz, CDCl$_3$): δ 1.15, 1.2, 1.25 and 1.3 ppm (s, 3H, 4CH$_3$), 1.6–1.8 ppm (m, 4H, 2CH$_2$), 3.7 ppm (m, 4H, 2CH$_2$), 6.6 and 7.8 ppm (d, 1H, aromatics), 9.6 ppm (s, 1H, CHO)

Along with the above product, there was obtained, as a minor product, 1,1,7,7-tetramethyljulolidine-8-carbaldehyde (7) of the following formula at a yield of 20%.

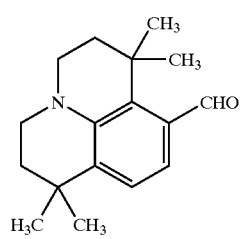

(7)

The analytical data of this minor product are shown below. $^1$H NMR (270 MHz, CDCl$_3$): δ 1.6 and 1.7 ppm (s, 6H, 2CH$_3$), 1.5–2.2 ppm (m, 4H, 2CH$_2$), 3.2–3.8 ppm (m, 4H, 2CH$_2$), 7.7 and 6.9 ppm (m, 1H, aromatics), 9.7 ppm (s, 1H, CHO)

A preparatory example of a julolidyl-substituted styryl compound is now described.
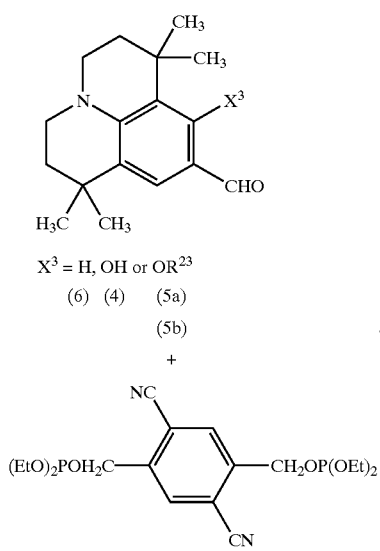
X³ = H, OH or OR²³
(6) (4) (5a)
     (5b)
+
NaH/THF
———————→
Wittig-Horner Reaction
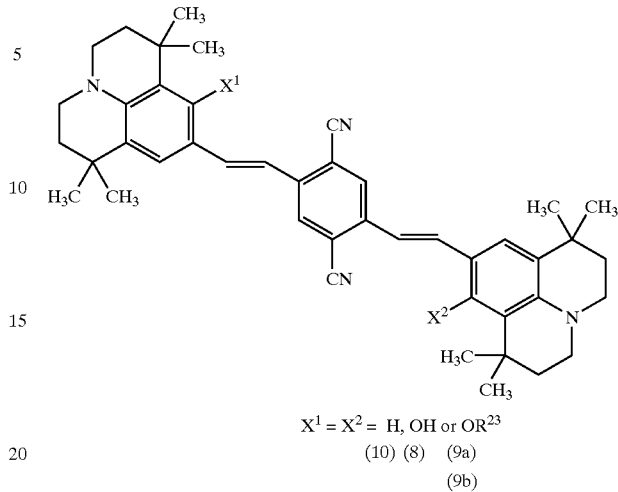
X¹ = X² = H, OH or OR²³
(10) (8) (9a)
          (9b)
In particular, this reaction is expressed according to the following reaction sequence:
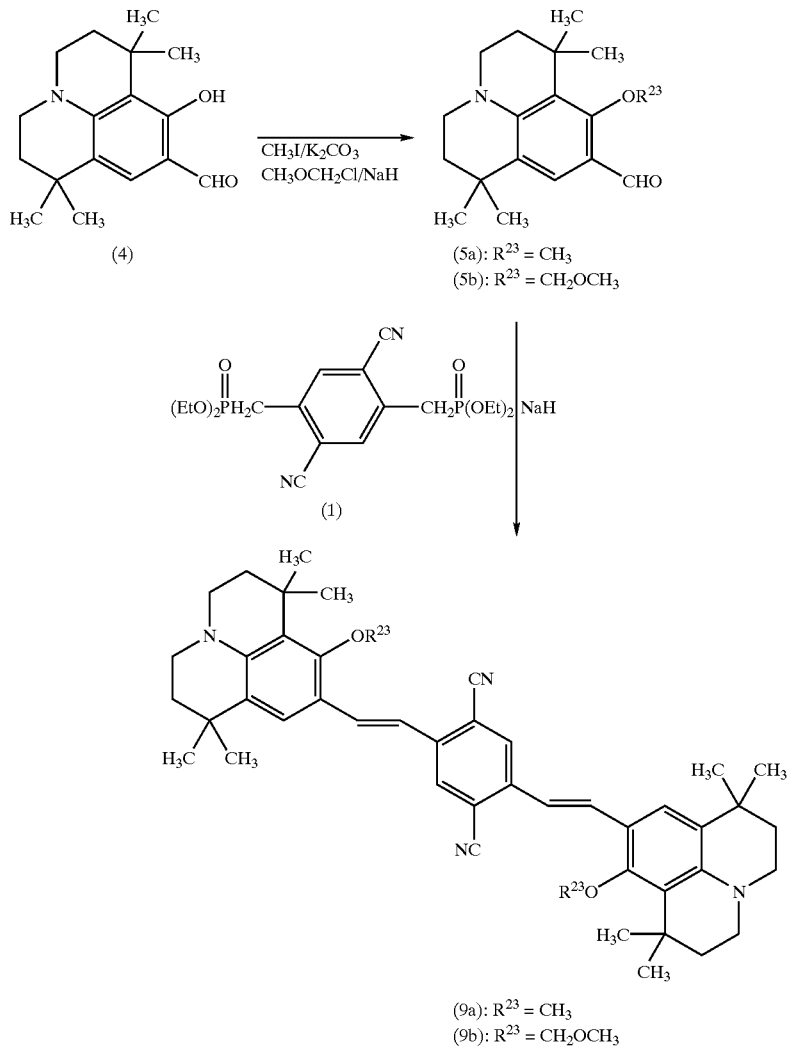

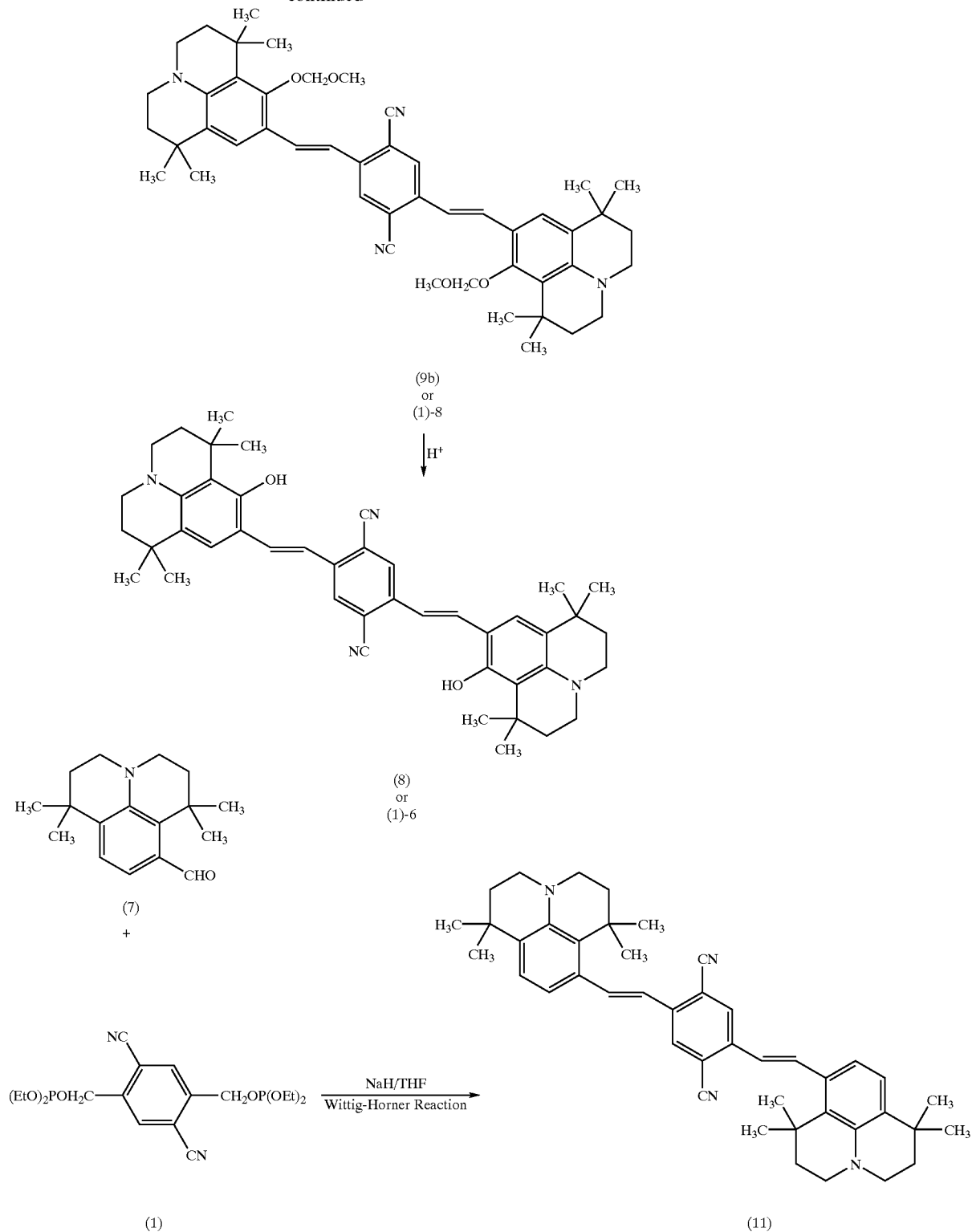

In a typical procedure, 794 mg (4.78 mmol) of triethyl phosphite was dropped in 750 mg (2.39 mmol) of 2,5-di (bromomethyl)terephthalonitrile, followed by agitation at 125° C. for 30 minutes to obtain diphosphonic acid ester (1). Instead, where it was intended to use diphosphonium (2), 750 mg (2.39 mmol) of 2,5-di(bromomethyl)-terephthalonitrile and 1.38 g (5.26 mmol) of triphenylphosphine were dissolved in xylene, followed by refluxing for 20 hours to obtain diphosphonium (2). on the other hand, 1.23 g (53 mmol, dispersed in an oil at 60%) was charged into a 300 ml three-necked round bottom flask equipped with a nitrogen introducing pipe and a dropping funnel and having a magnetic stirrer, and was washed three times with dry pentane under vigorous agitation. Immediately after removal of an oily substance, sodium hydride was suspended in 20 ml of dry THF (tetrahydrofuran).

Thereafter, 4.95 mmol of diphosphonic acid ester (1) or diphosphonium (2) in 50 ml of dry THF was added slowly to the reaction mixture in 1 hour. The reaction mixture was agitated for further 1 hour, in which 10 mmol of each of the aldehydes (4), (5a), (5b), (6) and (7) in 50 ml of THF was dropped, for example.

The reaction mixture was isolated through chromatography and subsequently quenched with 1 ml of ice. Thus cooled reaction mixture was poured into a 5% sodium bicarbonate aqueous solution, extracted with dichloromethane (3×50 ml), washed with a saline solution (1×20 ml) and dried over anhydrous sodium sulfate. The solvent was removed by a rotary evaporator, followed by purification of the product (8), (9a), (9b), (10) or (11) through column chromatography ($SiO_2$, THF/hexane) and re-crystallization from acetone/hexane.

In another procedure, 7.72 mmol of sodium hydride (60% dispersion in a mineral oil) was washed twice with a small amount of hexane in an atmosphere of nitrogen, suspended in 5 ml of dry tetrahydrofuran, and cooled down to −78° C. A solution of phosphonic acid ester (1) in an amount corresponding to 1.93 mmol and 1.49 g (5.18 mmol) of 8-methoxy-1,1,7,7-tetramethyljulolidine-9-carbaldehyde (5a) dissolved in 60 ml of tetrahydrofuran was dropped in the suspension, after which the temperature of the mixture was raised and agitated at room temperature for 1 hour.

The reaction solution was quenched with a small amount of ice, washed with a saturated saline solution and dried over sodium sulfate. Silica chromatography (Wakogel C-300, tetrahydrofuran:hexane=1:8) was used for isolation and purification, followed by re-crystallization from acetone-hexane and repeated washings of the resultant precipitate with ethanol to obtain 813 mg (yield: 61%) of the julolidyl-substituted styryl compound (9a).

Moreover, 10.4 mmol of sodium hydride (60% dispersion in a mineral oil) was washed twice with a small amount of hexane in an atmosphere of nitrogen, suspended in 10 ml of dry tetrahydrofuran, and dropped in 25 ml of a dry tetrahydrofuran solution of phosphoric acid ester (1) in an amount corresponding to 1.73 mmol at 0° C., followed by agitation for 5 minutes. A solution of 2.5 mmol of 8-methoxymethoxy-1,1,7,7-tetramethyljulolidine-9-carbaldehyde (5b) dissolved in 40 ml of tetrahydrofuran was dropped at 0° C., and was raised in temperature and agitated at room temperature for further 1 hour.

The reaction solution was quenched with a small amount of ice, washed with a saturated saline solution and dried over sodium sulfate. Silica chromatography (Wakogel C-300, toluene:hexane=1:1→) tetrahydrofuran:hexane=1:1) was used for isolation and purification, followed by re-crystallization from toluene-ethanol and repeated washings of the resultant precipitate with ethanol (EtOH) to obtain 309 mg (yield: 24%) of the julolidyl-substituted styryl compound (9b).

Further, 76.3 mg (0.101 mmol) of julolidyl-substituted styryl compound (9b) was dissolved in 15 ml of chloroform, to which 0.5 ml of concentrated hydrochloric acid and 2 ml of ethanol were added, followed by heating and agitation at 50° C. for 4 hours. The reaction solution was cooled, to which 20 ml of a potassium carbonate aqueous solution was added for neutralization. The resultant insoluble component was removed by filtration and extracted with tetrahydrofuran, followed by washing with a diluted hydrochloric acid solution and then with a saturated saline solution and drying over sodium sulfate. Silica gel chromatography (Wakogel C-300, toluene) was used for isolation and purification, followed by re-crystallization from toluene to obtain 5 mg (yield: 67%) of julolidyl-substituted styryl compound (8).

Product (9a) or Compound of Structural Formula (1)-1 (Wherein $X^1=X^2=OCH_3$)

This product (9a) was obtained, as shown in the afore-indicated reaction scheme, through reaction between 8-methoxy-1,1,7,7-tetramethyljulolidine-9-carbaldehyde (5a) and diphosphonic acid ester (1).

The analytical data of this product are shown below.
FAB-MS: m/e=695 $^1$H NMR (270 MHz, $CDCl_3$): δ 1.3 and 1.6 ppm (s, 12H, $CH_3$), 1.8 ppm (m, 4H, $CH_2$), 3.2 ppm (m, 4H, $CH_2$), 3.8 ppm (s, 6H, $OCH_3$), 7.0 ppm (s, 2H, aromatic), 7.1 ppm (d, 2H, CH=), 7.4 ppm (d, 2H, CH=), 8.0 ppm (s, 2H, aromatic)

Figure 6:
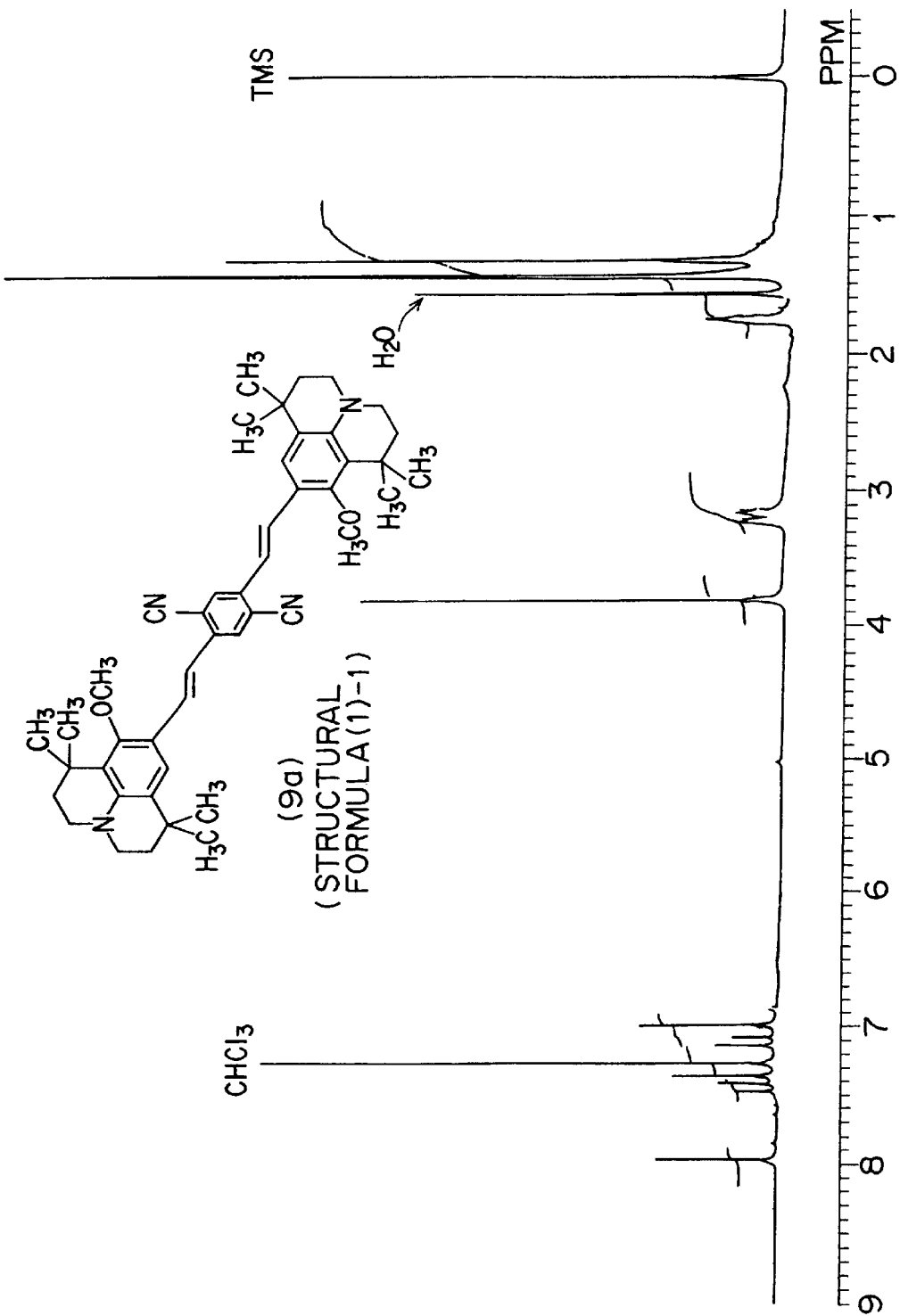
FIG. 6 is a $^1$H NMR spectrogram of a julolidyl-substituted styryl compound (9a) (or structural formula ((1)-1) usable in the invention.

The $^1$H NMR spectrum is shown in FIG. 6 wherein the abbreviation "TMS" means tetramethylsilane as a reference herein and whenever it appears hereinafter. UV-visible absorption spectrum (UV-Vis) ($CHCl_3$): λmax=508 nm Photoluminescent spectrum (PL) ($CHCl_3$)=$PL_{max}$=600 nm (ex. λ=508 nm)

Product (9b) or Compound of Structural Formula (1)-8 ($X^1=X^2=OCH_2OCH_3$)

This product (9b) is, as shown in the afore-indicated reaction scheme, obtained through reaction between 8-methoxymethoxy-1,1,7,7-tetramethyljulolidine-9-carbaldehyde (5b) and diphosphonic acid ester (1).

The analytical data of this product are shown below.
FAB-MS: m/e=755 $^1$H NMR (270 MHz, $CDCl_3$): δ 1.3 and 1.5 ppm (s, 12H, $CH_3$), 1.7 ppm (m, 4H, $CH_2$), 3.2 ppm (m, 4H, $CH_2$), 3.7 ppm (s, 6H, $CH_3O$), 5.0 ppm (s, 4H, $CH_2O$), 7.1 ppm (d, 2H, CH=), 7.4 ppm (s, 2H, aromatic), 7.6 ppm (d, 2H, CH=), 8.0 ppm (s, 2H, aromatic)

Figure 7:
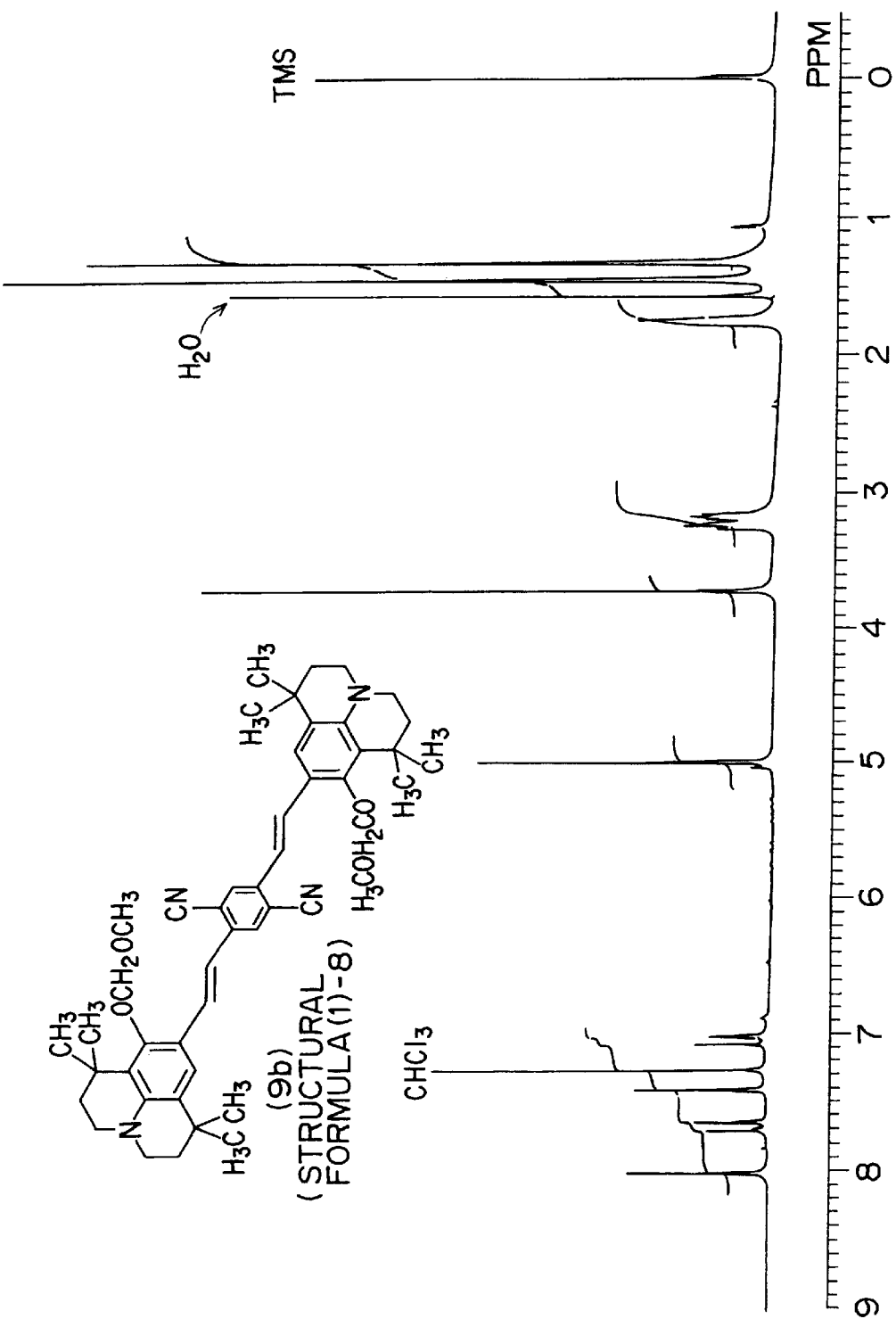
FIG. 7 is a $^1$H NMR spectrogram of a julolidyl-substituted styryl compound (9b) (or structural formula ((1)-8) usable in the invention.

The $^1$H NMR spectrum is shown in FIG. 7. UV-visible absorption spectrum (UV-Vis) ($CHCl_3$): λmax=505 nm Photoluminescent spectrum (PL) ($CHCl_3$)=$PL_{max}$=590 nm (ex. λ=505 nm)

Product (8) or Compound of Structural Formula (1)-6 ($X^1=X^2=OH$)

This product (8) is, as shown in the afore-indicated reaction scheme, obtained through hydrolysis of 8-methoxymethoxy-1,1,7,7-tetramethyljulolidine-9-carbaldehyde (9b).

The analytical data of this product are shown below.
FAB-MS: m/e=667 $^1$H NMR (270 MHz, $CDCl_3$): δ 1.3 and 1.5 ppm (s, 12H, $CH_3$), 1.8 ppm (m, 4H, $CH_2$), 3.4 ppm (m, 4H, $CH_2$), 5.1 ppm (s, 2H, OH), 7.1 ppm (d, 2H, CH=), 7.3 ppm (s, 2H, aromatics), 7.5 ppm (d, 2H, CH=), 7.9 ppm (s, 2H, aromatics)

Figure 8:
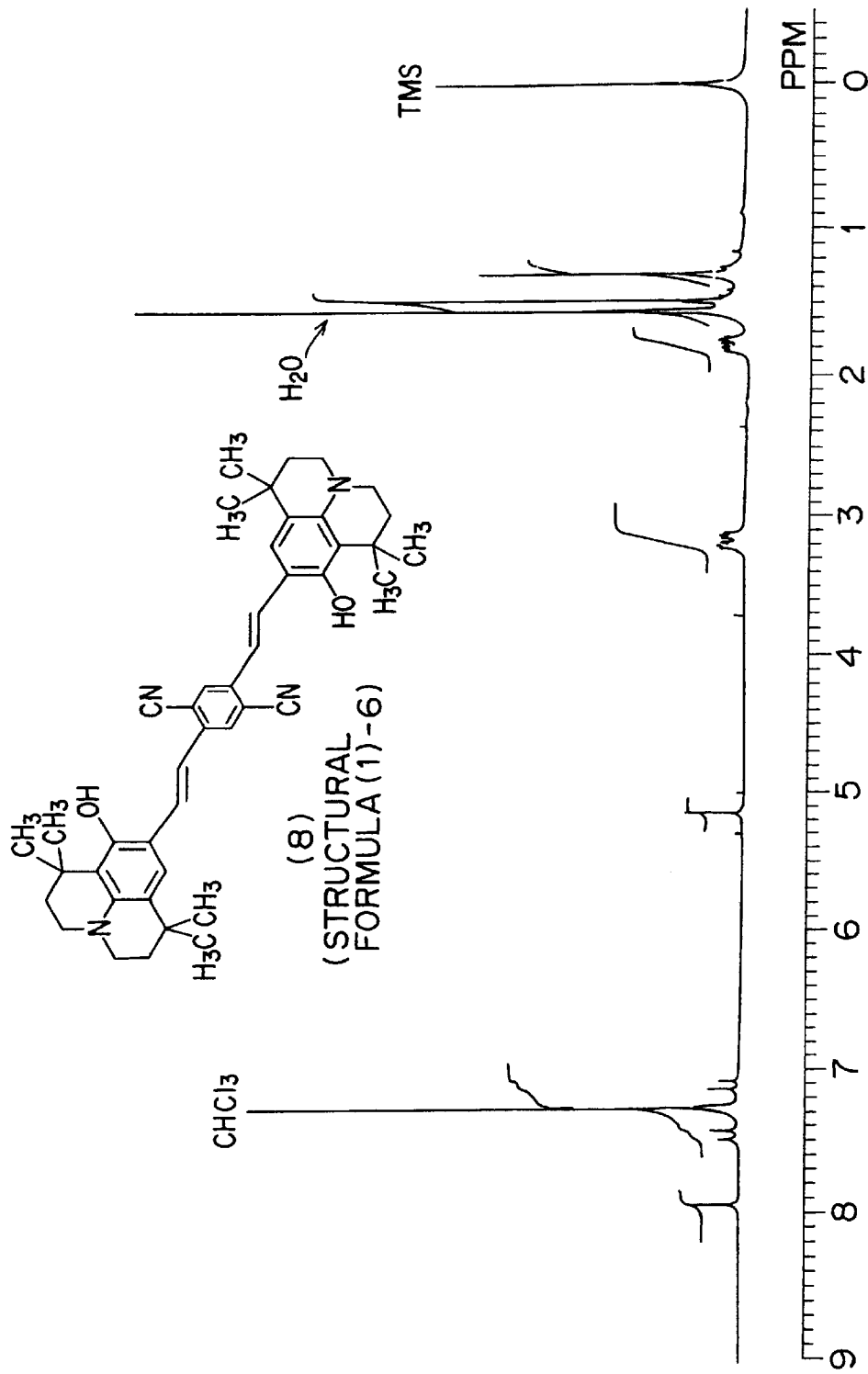
FIG. 8 is a $^1$H NMR spectrogram of a julolidyl-substituted styryl compound (8) (or structural formula ((1)-6) usable in the invention.

The $^1$H NMR spectrum is shown in FIG. 8. UV-visible absorption spectrum (UV-Vis) ($CHCl_3$): λmax=509 nm Photoluminescent spectrum (PL) ($CHCl_3$)=$PL_{max}$=610 nm (ex. λ=509 nm)

Product (10) ($X^1=X^2=H$)

This product (10) is, as shown in the afore-indicated reaction scheme, obtained through reaction between 1,1,7,7-tetramethyljulolidine-9-carbaldehyde (6) and diphosphonic acid ester (1).

The analytical data of this product are shown below.
TOF-MASS spectrum (time of flight mass spectrum): m/e 634 (m+) $^1$H NMR (400 MHz, $CDCl_3$): δ 1.5 and 1.6 ppm (s, 12H, $4CH_3$), 1.8–2.0 ppm (m, 8H, $4CH_2$), 2.8 ppm (m, 8H, $4CH_2$), 8.0–6.9 ppm (m, 10H, aromatics and 2CH=CH) Absorption spectrum by UV-visible light spectroscopy (UV-Vis) ($CHCl_3$): λmax=481 nm Photoluminescent spectrum (PL) ($CHCl_3$)=$PL_{max}$=590 nm (ex. λ=481 nm)

Product (11)

This product (11) is, as shown in the afore-indicated reaction scheme, obtained through reaction between 1,1,7,7-tetramethyljulolidine-8-carbaldehyde (7) and diphosphonic acid ester (1).

The analytical data of this product are shown below. TOF-MASS spectrum (time of flight mass spectrum): m/e 634 (m+) $^1$H NMR (400 MHz, CDCl$_3$): δ 1.0 and 1.5 ppm (s, 12H, 4CH$_3$), 1.5–2.2 ppm (m, 8H, 4CH$_2$), 3.7 ppm (m, 8H, 4CH$_2$), 8.8–6.8 ppm (m, 10H, aromatics and 2CH=CH) Absorption spectrum by UV-visible light spectroscopy (UV-U Vis) (CHCl$_3$): λmax=474 nm Photoluminescent spectrum (PL) (CHCl$_3$)=PL$_{max}$=590 nm (ex. λ=474 nm)

Optical Properties of the Respective Products

The optical properties of the products shown above are summarized in the following table.

| Product | UV-Vis (CHCl$_3$) | PL (CHCl$_3$) |
|---|---|---|
| (9a) ($X^1 = X^2 = OCH_3$) | 508 nm | 600 nm |
| (9b) ($X^1 = X^2 = OCH_2OCH_3$) | 505 nm | 590 nm |
| (8) ($X^1 = X^2 = OH$) | 509 nm | 610 nm |
| (10) ($X^1 = X^2 = H$) | 481 nm | 590 nm |
| (11) | 474 nm | 590 nm |

From these results, it will be seen that the julolidyl-substituted styryl compounds are able to emit intense luminescence, and are suitable for use as green to red light-emitting materials in an organic electroluminescent device.

Examples of fabricating an organic electroluminescent device using the julolidyl-substituted styryl compounds are shown.

EXAMPLE 1

This example illustrates fabrication of an organic electroluminescent device having a single hetero structure using, as a hole transport luminescent material, a compound of the following structural formula (1)-1, which is a julolidyl-substituted styryl compound of the general formula [I] wherein $R^9$ and $R^{11}$, respectively, represent a cyano group and $X^1$ and $X^2$, respectively, represent a methoxy group.

Structural Formula (1)-1:

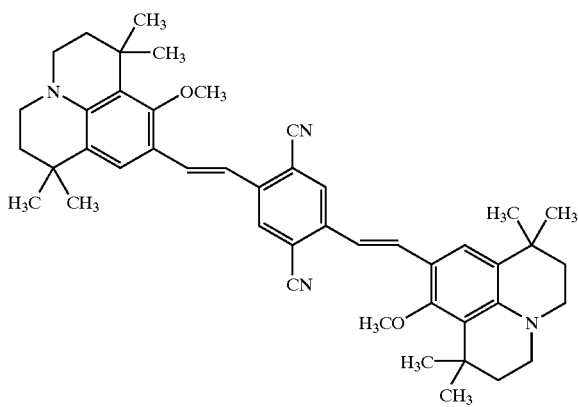

A 30 mm×30 mm glass substrate, which had been formed with a 100 nm thick anode made of ITO on one surface thereof, was set in a vacuum deposition apparatus. A metallic mask having a plurality of 2.0 mm×2.0 mm unit openings was placed, as a deposition mask, closely to the substrate. The compound of the above structural formula (1)-1 was subjected to vacuum deposition at a vacuum of 10$^{-4}$ Pa or below to form, for example, a 50 nm thick hole transport layer (serving also as a luminescent layer) The deposition rate was at 0.1 nm/second.

Further, Alq$_3$ (tris(8-quinolinol)aluminium) of the following structural formula was provided as an electron transport material and was deposited in contact with the hole transport layer. The electron transport layer made of Alq$_3$ was set at a thickness, for example, of 50 nm, and the deposition rate was at 0.2 nm/second. Alq$_3$:

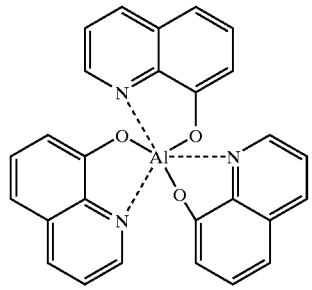

A built-up film of Mg and Ag provided as a cathode material was used. To this end, Mg and Ag were, respectively, deposited at a deposition rate of 1 nm/second to form, for example, a 50 nm thick Mg film and a 150 nm thick Ag film. In this way, an organic electroluminescent device as shown in FIG. 3 was fabricated in Example 1.

Figure 9:
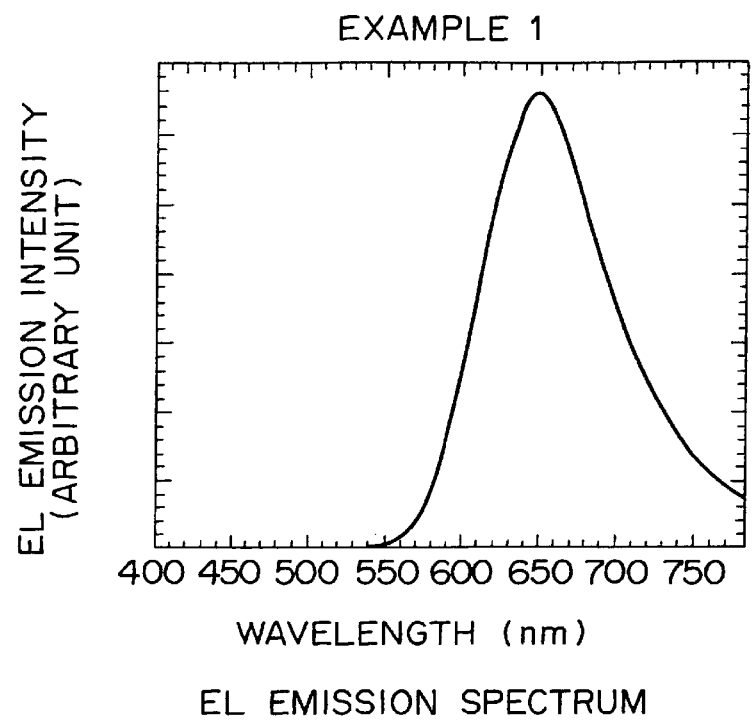
FIG. 9 is an emission spectrogram of an organic electroluminescent device of Example 1 of the invention.
Figure 10:
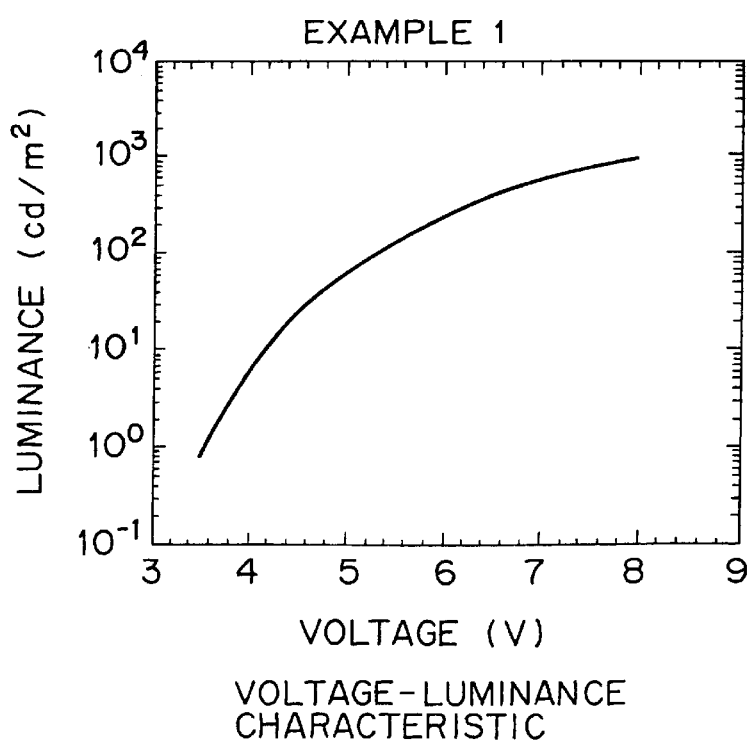
FIG. 10 is a graph showing a voltage-luminance characteristic of the organic electroluminescent device of Example 1 of the invention.

Luminescent characteristics of the device were evaluated by applying a forward bias DC voltage to the thus fabricated organic electroluminescent device of Example 1 in an atmosphere of nitrogen. The luminescent color was red, and the device was then subjected to spectral measurement, with the result that, as shown in FIG. 9, a spectrum having a luminescent peak at 650 nm was obtained. The spectral measurement was performed by use of a spectroscope made by Otsuka Electronic Co., Ltd. and using a photodiode array as a detector. Moreover, when the device was subjected to voltage-luminance measurement, there could be obtained a luminance of 1,000 cd/m$^2$ at 8 V as is particularly shown in FIG. 10.

After the fabrication of the organic electroluminescent device, the device was allowed to stand over one month in an atmosphere of nitrogen, no device degradation was observed. In addition, when the device was subjected to forced degradation wherein continuous light emission was carried out at an initial luminance of 300 cd/m$^2$ while keeping an electric current at a given level. As a consequence, it took 600 hours before the luminance was reduced to half.

EXAMPLE 2

This example illustrates fabrication of an organic electroluminescent device having a single hetero structure using, as an electron transport luminescent material, a compound of the structural formula (1)-1, which is a julolidyl-substituted styryl compound of the general formula [I] wherein $R^9$ and $R^{11}$, respectively, represent a cyano group and $X^1$ and $X^2$, respectively, represent a methoxy group.

A 30 mm×30 mm glass substrate, which had been formed with a 100 nm thick anode made of ITO on one surface thereof, was set in a vacuum deposition apparatus. A metallic mask having a plurality of 2.0 mm×2.0 mm unit openings was placed, as a deposition mask, closely to the substrate. α-NPD (α-naphthylphenyldiamine) of the following structural formula was subjected to vacuum deposition at a vacuum of $10^{-4}$ Pa or below to form, for example, a 50 nm thick hole transport layer. The deposition rate was at 0.1 nm/second. α-NPD:

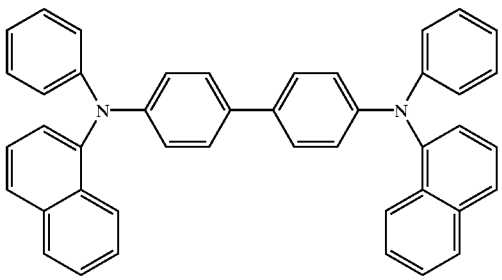

Further, the compound of the structural formula (1)-1 used as an electron transport material was vacuum deposited in contact with the hole transport layer. The thickness of the electron transport layer (serving also as a luminescent layer) composed of the compound of the structural formula (1)-1 was set, for example, at 50 nm, and the deposition rate was at 0.2 nm/second.

A built-up film of Mg and Ag provided as a cathode material was used. More particularly, Mg and Ag were, respectively, deposited at a deposition rate of 1 nm/second to form, for example, a 50 nm thick Mg film and a 150 nm thick Ag film. In this way, an organic electroluminescent device of Example 2 as shown in FIG. 3 was fabricated.

Figure 11:
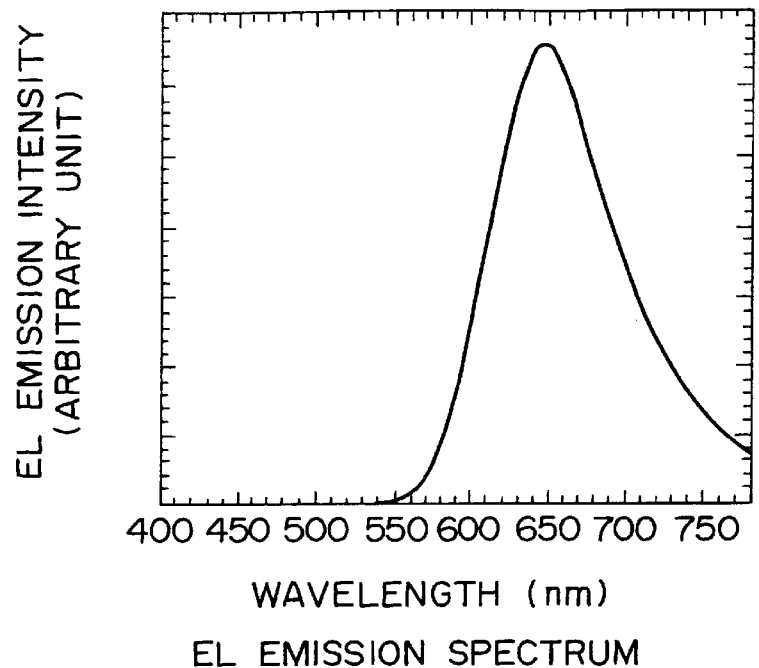
FIG. 11 is an emission spectrogram of an organic electroluminescent device of Example 2 of the invention.
Figure 12:
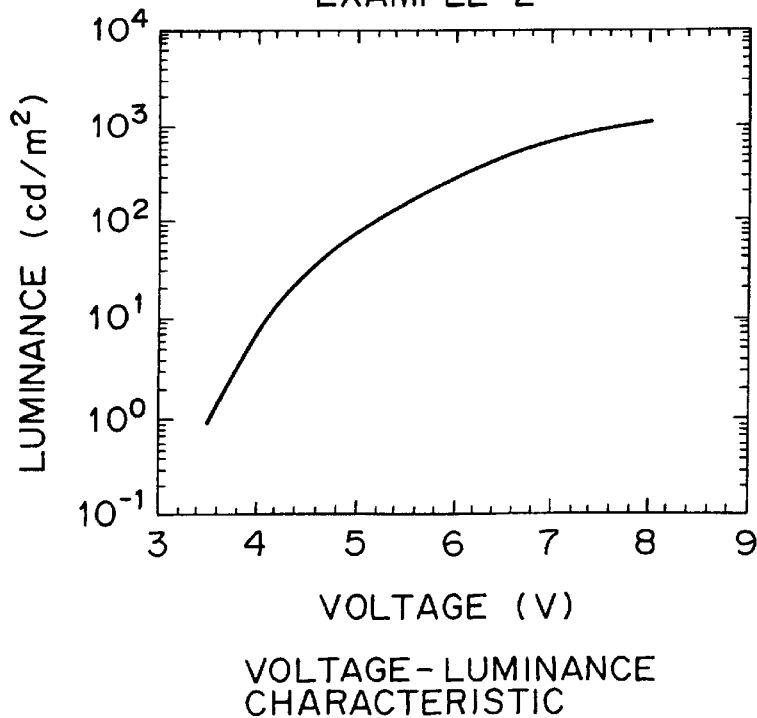
FIG. 12 is a graph showing a voltage-luminance characteristic of an organic electroluminescent device of Example 2 of the invention.

Luminescent characteristics were evaluated by applying a forward bias DC voltage to the thus fabricated organic electroluminescent device of Example 2 in an atmosphere of nitrogen. The luminescent color was red, and the device was then subjected to spectral measurement as in Example 1, with the result that, as shown in FIG. 11, a spectrum having a luminescent peak at 650 nm was obtained. Moreover, when the device was subjected to voltage-luminance measurement, there could be obtained a luminance of 1,100 cd/m² at 8 V as is particularly shown in FIG. 12.

After the fabrication of the organic electroluminescent device, the device was allowed to stand over one month in an atmosphere of nitrogen, no degradation of the device was observed. In addition, when the device was subjected to forced degradation wherein continuous light emission was carried out at an initial luminance of 300 cd/m² while keeping an electric current at a given level. As a consequence, it took 550 hours before the luminance was reduced to half.

EXAMPLE 3

This example illustrates fabrication of an organic electroluminescent device having a double hetero structure using, as a luminescent material, a compound of the structural formula (1)-1, which is a julolidyl-substituted styryl compound of the general formula [I] wherein $R^9$ and $R^{11}$, respectively, represent a cyano group and $X^1$ and $X^2$, respectively, represent a methoxy group.

A 30 mm×30 mm glass substrate, which had been formed with a 100 nm thick anode made of ITO on one surface thereof, was set in a vacuum deposition apparatus. A metallic mask having a plurality of 2.0 mm×2.0 mm unit openings was placed, as a deposition mask, near the substrate, followed by subjecting α-NPD (α-naphthylphenyldiamine) of the afore-indicated structural formula to vacuum deposition at a vacuum of $10^{-4}$ Pa or below to form, for example, a 30 nm thick hole transport layer. The deposition rate was at 0.2 nm/second.

Further, the compound of the afore-indicated structural formula (1)-1 used as a luminescent material was vacuum deposited in contact with the hole transport layer. The thickness of the luminescent layer composed of the compound of the structural formula (1)-1 was set, for example, at 30 nm, and the deposition rate was at 0.2 nm/second.

Alq₃ of the afore-indicated structural formula used as an electron transport material was deposited in contact with the luminescent layer. The thickness of the Alq₃ layer was set, for example, at 30 nm, and the deposition rate was at 0.2 nm/second.

A built-up film of Mg and Ag provided as a cathode material was used. More particularly, Mg and Ag were, respectively, deposited at a deposition rate of 1 nm/second to form, for example, a 50 nm thick Mg film and a 150 nm thick Ag film. In this way, an organic electroluminescent device of Example 3 as shown in FIG. 4 was fabricated.

Figure 13:
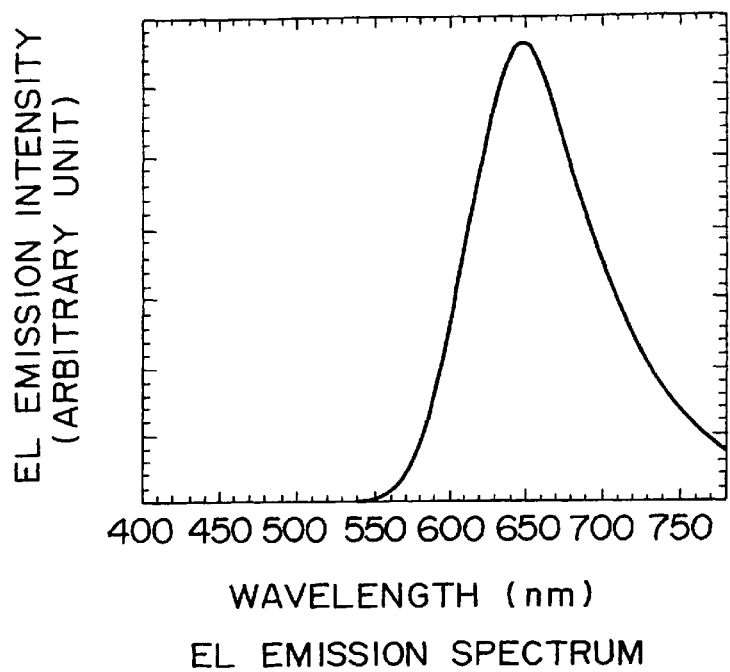
FIG. 13 is an emission spectrogram of an organic electroluminescent device of Example 3 of the invention.
Figure 14:
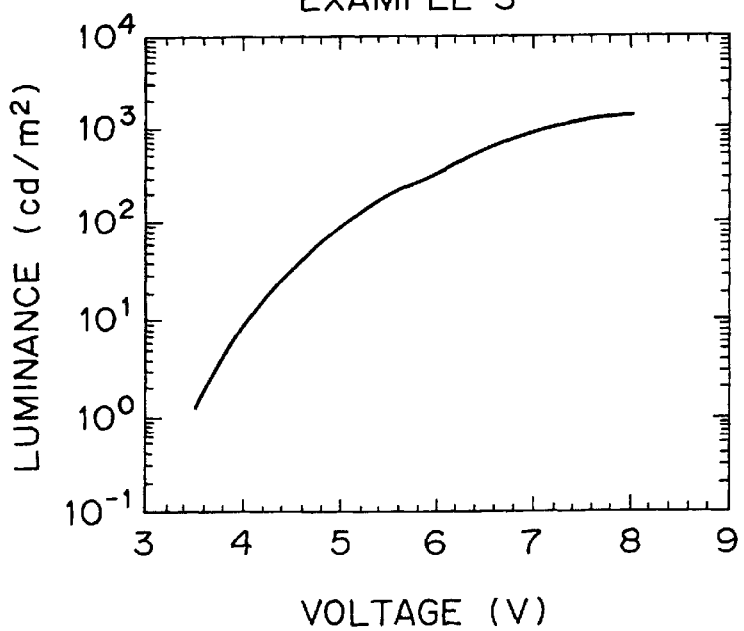
FIG. 14 is a graph showing a voltage-luminance characteristic of an organic electroluminescent device of Example 3 of the invention.

Luminescent characteristics of the device were evaluated by applying a forward bias DC voltage to the thus fabricated organic electroluminescent device of Example 3 in an atmosphere of nitrogen. The luminescent color was red, and the device was subjected to spectral measurement, with the result that a spectrum having a luminescent peak at 650 nm was obtained as shown in FIG. 13. Moreover, when the device was subjected to voltage-luminance measurement, there could be obtained a luminance of 1,500 cd/m² at 8 V as shown in FIG. 14.

After the fabrication of the organic electroluminescent device, the device was allowed to stand over one month in an atmosphere of nitrogen, no degradation of the device was observed. In addition, when the device was subjected to forced degradation wherein continuous light emission was carried out at an initial luminance of 300 cd/m² while passing an electric current at a given level. As a consequence, it took 800 hours before the luminance was reduced to half.

EXAMPLE 4

Example 2 was repeated with respect to the layer arrangement and the film formation procedures except that TPD (triphenyldiamine derivative) of the following structural formula was used, as a hole transport material, in place of α-NPD, thereby fabricating an organic electroluminescent device. TPD:

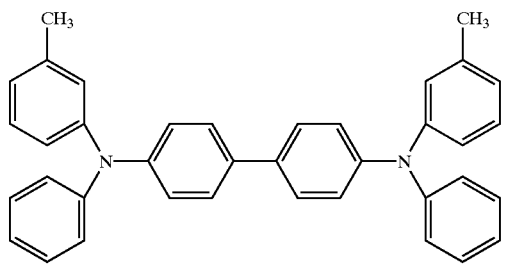

The organic electroluminescent device of this example assumed red luminescence, like Example 2. The results of spectral measurement reveal that the spectrum was in coincidence with that of the organic electroluminescent device of Example 2.

EXAMPLE 5

This example illustrates fabrication of an organic electroluminescent device having a single hetero structure using, as a hole transport luminescent material, a compound of the following structural formula (1)-7, which is a julolidyl-substituted styryl compound of the general formula [I] wherein $R^9$ and $R^{11}$, respectively, represent a fluorine atom and $X^1$ and $X^2$, respectively, represent a methoxy group.
Structural Formula (1)-7:

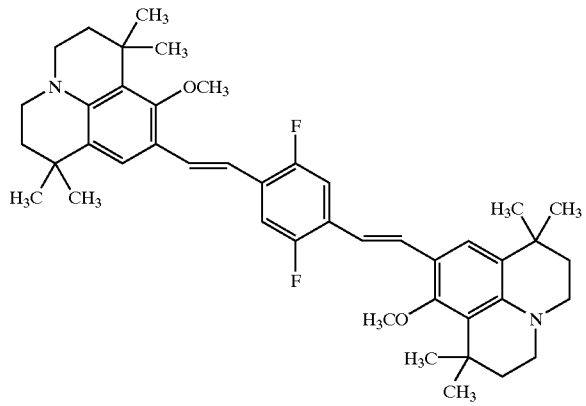

A 30 mm×30 mm glass substrate, which had been formed with a 100 nm thick anode made of ITO on one surface thereof, was set in a vacuum deposition apparatus. A metallic mask having a plurality of 2.0 mm×2.0 mm unit openings was placed, as a deposition mask, near the substrate, followed by subjecting the compound of the above structural formula (1)-7 to vacuum deposition at a vacuum of $10^{-4}$ Pa or below to form, for example, a 50 nm thick hole transport layer (serving also as a luminescent layer). The deposition rate was at 0.1 nm/second.

Further, Alq$_3$ (tris(8-quinolinol)aluminium) was provided as an electron transport material and was deposited in contact with the hole transport layer. The electron transport layer made of Alq$_3$ was set at a thickness, for example, of 50 nm, and the deposition rate was at 0.2 nm/second.

A built-up film of Mg and Ag provided as a cathode material was used. More particularly, Mg and Ag were, respectively, deposited at a deposition rate of 1 nm/second to form, for example, a 50 nm thick Mg film and a 150 nm thick Ag film. In this way, an organic electroluminescent device of Example 5 as shown in FIG. 3 was fabricated.

Luminescent characteristics of the device were evaluated by applying a forward bias DC voltage to the thus fabricated organic electroluminescent device of Example 5 in an atmosphere of nitrogen. The luminescent color was red, and the device was subjected to spectral measurement, with the result that a spectrum having a luminescent peak at 640 nm was obtained. The spectral measurement was performed by use of a spectroscope made by Otsuka Electronic Co., Ltd. and using a photodiode array as a detector. Moreover, when the device was subjected to voltage-luminance measurement, there could be obtained a luminance of 1,000 cd/m$^2$ at 8 V.

After the fabrication of the organic electroluminescent device, the device was allowed to stand over one month in an atmosphere of nitrogen, no degradation of the device was observed. In addition, when the device was subjected to forced degradation wherein continuous light emission was carried out at an initial luminance of 300 cd/m$^2$ while passing an electric current at a given level. As a consequence, it took 400 hours before the luminance was reduced to half.

EXAMPLE 6

This example illustrates fabrication of an organic electroluminescent device having a single hetero structure using, as an electron transport luminescent material, a compound of the following structural formula (1)-2, which is a julolidyl-substituted styryl compound of the general formula [I] wherein $R^9$ and $R^{11}$, respectively, represent a cyano group and $X^1$ and $X^2$, respectively, represent an ethoxy group.
Structural Formula (1)-2:

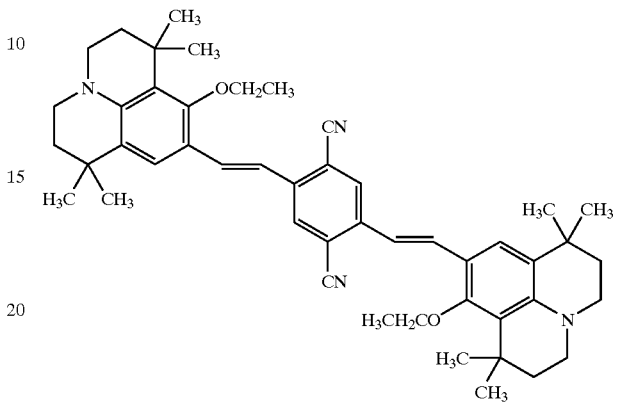

Example 2 was repeated with respect to the layer arrangement and the film formation procedures, thereby making an organic electroluminescent device.

The thus fabricated organic electroluminescent device of Example 6 was applied with a forward bias DC voltage in an atmosphere of nitrogen to evaluate its luminescent characteristics. The luminescent color was red, and a luminance of 500 cd/m$^2$ at 8 V was obtained. After the fabrication of the organic electroluminescent device, the device was allowed to stand over one month in an atmosphere of nitrogen, no degradation of the device was observed.

EXAMPLE 7

This example illustrates fabrication of an organic electroluminescent device having a single hetero structure using, as an electron transport luminescent material, a compound of the following structural formula (1)-3, which is a julolidyl-substituted styryl compound of the general formula [I] wherein $R^9$ and $R^{11}$, respectively, represent a cyano group and $X^1$ and $X^2$, respectively, represent a tertiary butoxy group.
Structural Formula (1)-3:

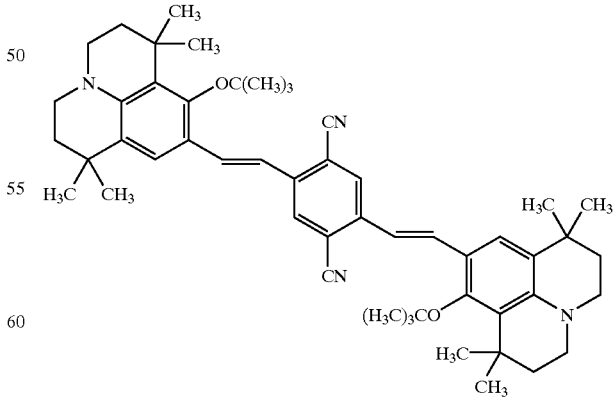

Example 2 was repeated with respect to the layer arrangement and the film formation procedures, thereby making an organic electroluminescent device.

The thus fabricated organic electroluminescent device of Example 7 was applied with a forward bias DC voltage in an atmosphere of nitrogen to evaluate its luminescent characteristics. The luminescent color was red, and a luminance of 400 cd/m² at 8 V was obtained. After the fabrication of the organic electroluminescent device, the device was allowed to stand over one month in an atmosphere of nitrogen, no degradation was observed.

EXAMPLE 8

This example illustrates fabrication of an organic electroluminescent device having a single hetero structure using, as an electron transport luminescent material, a compound of the following structural formula (1)-4, which is a julolidyl-substituted styryl compound of the general formula [I] wherein $R^9$ and $R^{11}$, respectively, represent a cyano group and $X^1$ and $X^2$, respectively, represent a methyl group.

Structural Formula (1)-4:

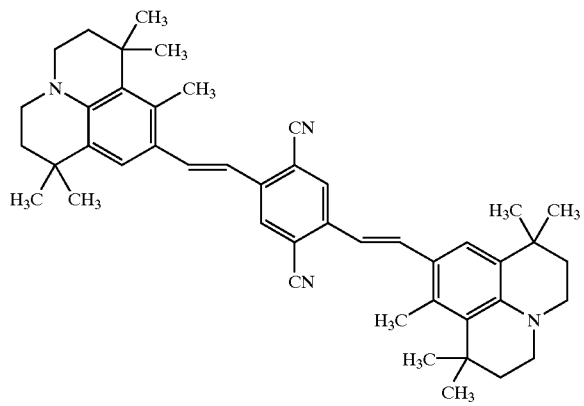

Example 2 was repeated with respect to the layer arrangement and the film formation procedures, thereby making an organic electroluminescent device.

The thus fabricated organic electroluminescent device of Example 8 was applied with a forward bias DC voltage in an atmosphere of nitrogen to evaluate its luminescent characteristics. The luminescent color was red, and a luminance of 550 cd/m² at 8 V was obtained. After the fabrication of the organic electroluminescent device, the device was allowed to stand over one month in an atmosphere of nitrogen, no degradation was observed.

EXAMPLE 9

This example illustrates fabrication of an organic electroluminescent device having a single hetero structure using, as an electron transport luminescent material, a compound of the following structural formula (1)-5, which is a julolidyl-substituted styryl compound of the general formula [I] wherein $R^9$ and $R^{11}$, respectively, represent a cyano group and $X^1$ and $X^2$, respectively, represent a phenyl group.

Structural Formula (1)-5:

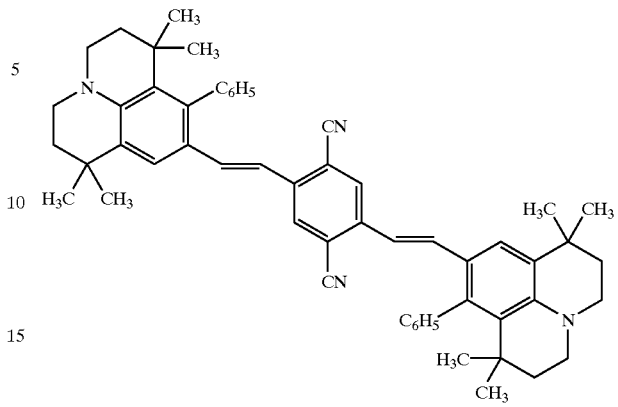

Example 2 was repeated with respect to the layer arrangement and the film formation procedures, thereby making an organic electroluminescent device.

The thus-fabricated organic electroluminescent device of Example 9 was applied with a forward bias DC voltage in an atmosphere of nitrogen to evaluate its luminescent characteristics. The luminescent color was red, and a luminance of 800 cd/m² at 8 V was obtained. After the fabrication of the organic electroluminescent device, the device was allowed to stand over one month in an atmosphere of nitrogen, no degradation was observed.

EXAMPLE 10

This example illustrates fabrication of an organic electroluminescent device having a single hetero structure using, as an electron transport luminescent material, a compound of the following structural formula (1)-6, which is a julolidyl-substituted styryl compound of the general formula [I] wherein $R^9$ and $R^{11}$, respectively, represent a cyano group and $X^1$ and $X^2$, respectively, represent a hydroxy group.

Structural Formula (1)-6:

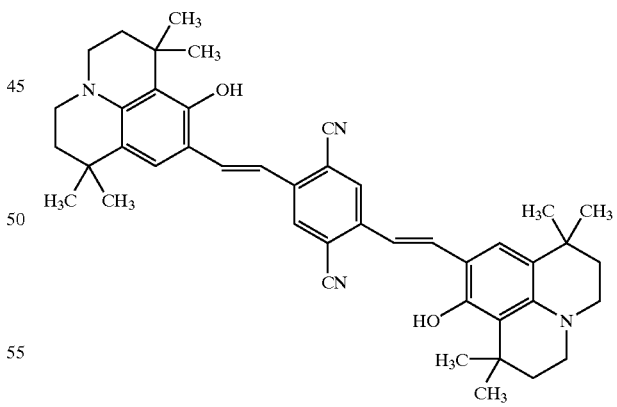

Example 2 was repeated with respect to the layer arrangement and the film formation procedures, thereby making an organic electroluminescent device.

The thus fabricated organic electroluminescent device of Example 10 was applied with a forward bias DC voltage in an atmosphere of nitrogen to evaluate its luminescent characteristics. The luminescent color was red, and a luminance of 300 cd/m² at 8 V was obtained. After the fabrication of the organic electroluminescent device, the device was allowed to stand over one month in an atmosphere of nitrogen, no degradation was observed.

As will be seen from the foregoing, the organic electroluminescent device of the invention, wherein an organic layer having a luminescent region therein is provided between an anode and a cathode and the organic layer contains at least one julolidyl-substituted styryl compound of the general formula [I] or [II], exhibits a high luminance and ensure stable red color luminescence. This styryl compound has a high glass transition point and melting point, and is thus excellent not only in heat resistance, but also in electric, thermal or chemical stability. The compound is amorphous in nature and is able to readily form a vitreous state, and is also sublimable, so that a uniform amorphous film can be formed by vacuum deposition or the like technique.

What is claimed is:

1. An organic electroluminescent device of the type which comprises an organic layer having a luminescent region and provided between an anode and a cathode, wherein said organic layer comprises, as an organic luminescent material, a julolidyl-substituted styryl compound of the following general formula [I] or [II]:

General Formula [I]:

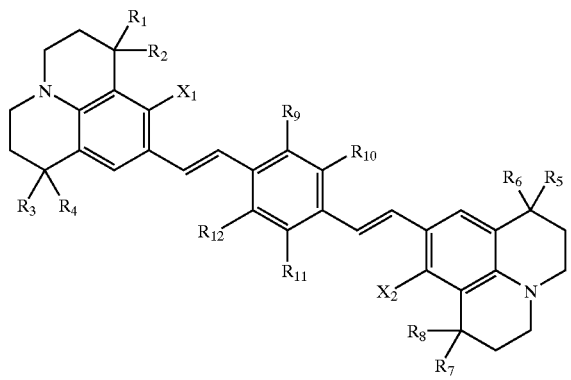

General Formula [II]:

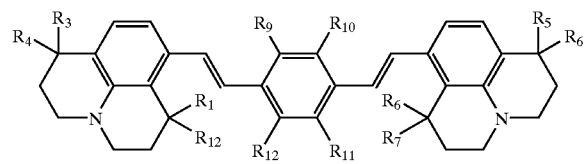

wherein $X^1$ and $X^2$ may be the same or different and, respectively, represent a hydrogen atom, a hydroxyl group or a saturated or unsaturated, unsubstituted or substituted alkoxyl group, an alkyl group, an amino group, an alkylamino group, or a substituted or unsubstituted aryl group, $R^1$, $R^2$, $R^3$, $R^4$, $R^5$, $R^6$, $R^7$ and $R^8$ may be the same or different and independently represent an alkyl group having up to 6 carbon atoms, and $R^9$, $R^{10}$, $R^{11}$ and $R^{12}$ may be the same or different and at least one of them represents an electron attracting group.

2. An organic electroluminescent device according to claim 1, wherein at least one of said $R^9$, $R^{10}$, $R^{11}$ and $R^{12}$ represents a cyano group, a nitro group or a halogen atom.

3. An organic electroluminescent device according to claim 1, wherein said organic layer has an organic built-up structure wherein a hole transport layer and an electron transport layer are built up, and said julolidyl-substituted styryl compound is used as a material for forming said hole transport layer.

4. An organic electroluminescent device according to claim 1, wherein said organic layer has an organic built-up structure wherein a hole transport layer and an electron transport layer are successively built up, and said julolidyl-substituted styryl compound is used as a material for forming said electron transport layer.

5. An organic electroluminescent device according to claim 1, wherein said organic layer has an organic built-up structure wherein a hole transport layer, a luminescent layer, and an electron transport layer are built up, and said julolidyl-substituted styryl compound is used as a material for forming said luminescent layer.

6. An organic electroluminescent device of the type which comprises an organic layer having a luminescent region and provided between an anode and a cathode, wherein said organic layer comprises, as an organic luminescent material, at least one julolidyl-substituted styryl compound represented by the following structural formula (1)-1, (1)-2, (1)-3, (1)-4, (1)-5, (1)-6, (1)-7 or (1)-8:

Structural Formula (1)-1:

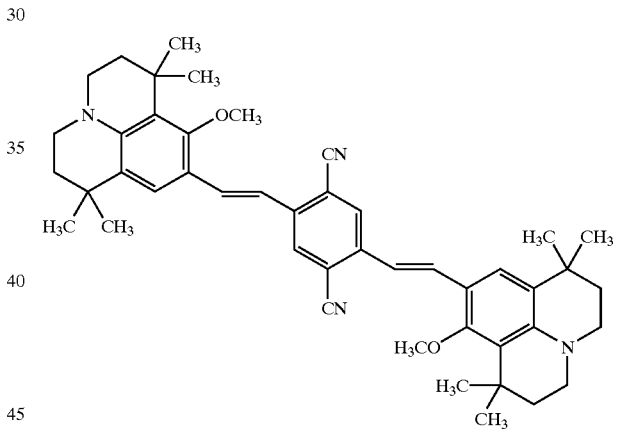

Structural Formula (1)-2:

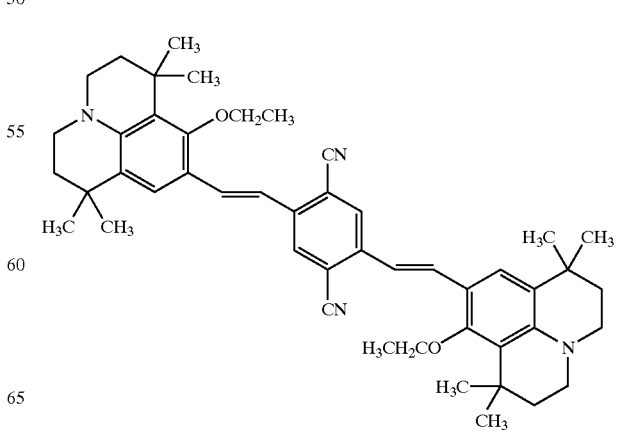

Structural Formula (1)-3:

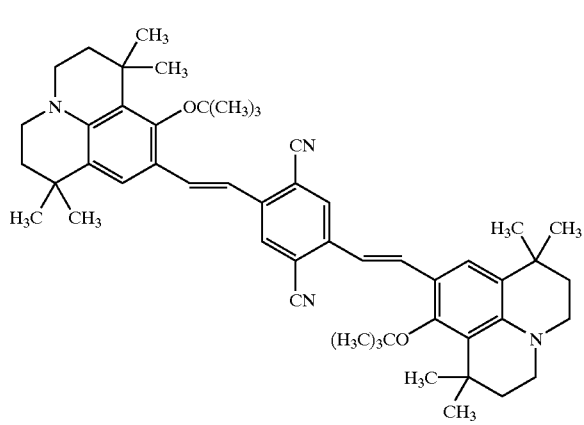

Structural Formula (1)-4:

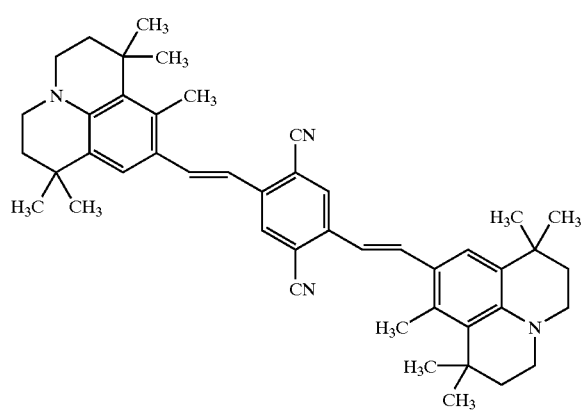

Structural Formula (1)-5:

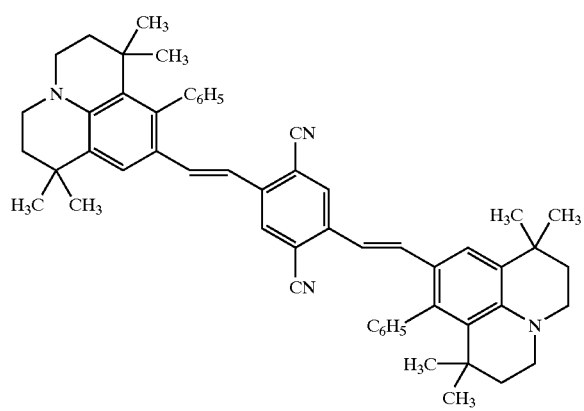

Structural Formula (1)-6:

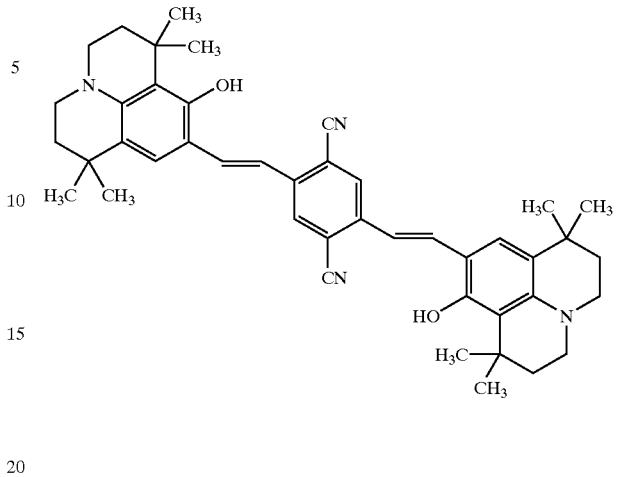

Structural Formula (1)-7:

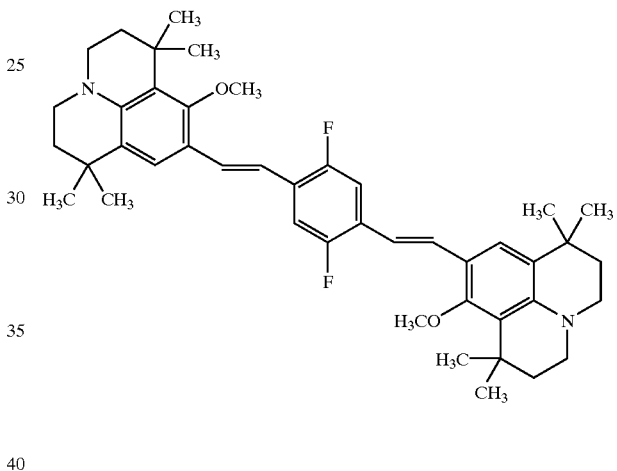

Structural Formula (1)-8:

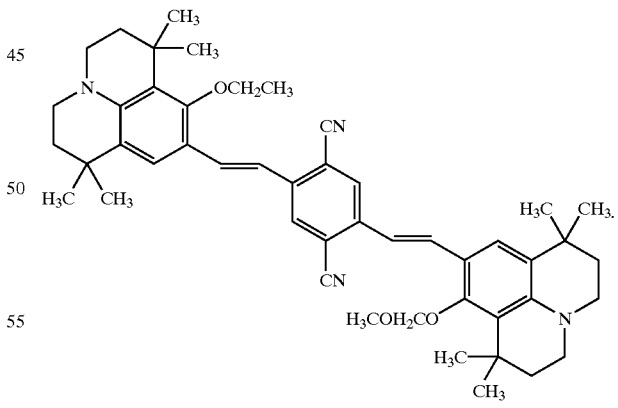

7. An organic electroluminescent device according to claim 6, wherein said organic layer has an organic built-up structure wherein a hole transport layer and an electron transport layer are built up, and said julolidyl-substituted styryl compound is used as a material for forming said hole transport layer.

8. An organic electroluminescent device according to claim 6, wherein said organic layer has an organic built-up structure wherein a hole transport layer and an electron transport layer are successively built up, and said julolidyl-substituted styryl compound is used as a material for forming said electron transport layer.

9. An organic electroluminescent device according to claim 6, wherein said organic layer has an organic built-up structure wherein a hole transport layer, a luminescent layer, and an electron transport layer are built up, and said julolidyl-substituted styryl compound is used as a material for forming said luminescent layer.

* * * * *

UNITED STATES PATENT AND TRADEMARK OFFICE
CERTIFICATE OF CORRECTION

PATENT NO. : 6,479,171 B1
DATED : November 12, 2002
INVENTOR(S) : Tadashi Ishibashi et al.

It is certified that error appears in the above-identified patent and that said Letters Patent is hereby corrected as shown below:

Title page,
Item [57], ABSTRACT,
Line 1, change "comprises" to -- comprising --.

Column 38,
Line 21, change "the. type" with -- the type --.

Column 40,
Line 46, change "$OCH_2CH_3$" with -- $OCH_2OCH_3$ --.

Signed and Sealed this

Twentieth Day of May, 2003

JAMES E. ROGAN
*Director of the United States Patent and Trademark Office*